US012761024B2

(12) United States Patent
Inotsume

(10) Patent No.: US 12,761,024 B2
(45) Date of Patent: Oct. 13, 2026

(54) MOTION ESTIMATION APPARATUS, MOTION ESTIMATION METHOD, PATH GENERATION APPARATUS, PATH GENERATION METHOD, AND COMPUTER-READABLE RECORDING MEDIUM

(71) Applicant: NEC Corporation, Minato-ku (JP)

(72) Inventor: Hiroaki Inotsume, Tokyo (JP)

(73) Assignee: NEC CORPORATION, Tokyo (JP)

( * ) Notice: Subject to any disclaimer, the term of this patent is extended or adjusted under 35 U.S.C. 154(b) by 181 days.

(21) Appl. No.: 18/032,864

(22) PCT Filed: Oct. 29, 2020

(86) PCT No.: PCT/JP2020/040670
§ 371 (c)(1),
(2) Date: Apr. 20, 2023

(87) PCT Pub. No.: WO2022/091305
PCT Pub. Date: May 5, 2022

(65) Prior Publication Data

US 2024/0019250 A1 Jan. 18, 2024

(51) Int. Cl.
*G06F 30/00* (2020.01)
*G01C 21/00* (2006.01)
(Continued)

(52) U.S. Cl.
CPC ......... *G01C 21/16* (2013.01); *G01C 21/3826* (2020.08); *G06F 30/27* (2020.01)

(58) Field of Classification Search
CPC ...... G01C 21/16; G01C 21/3826; G06F 30/27
(Continued)

(56) References Cited

U.S. PATENT DOCUMENTS

2017/0053169 A1* 2/2017 Cuban .................... G05D 1/104
2018/0080781 A1 3/2018 Freed
(Continued)

FOREIGN PATENT DOCUMENTS

JP H10-074188 A 3/1998
JP 2011-150627 A 8/2011
(Continued)

OTHER PUBLICATIONS

English translation of Written opinion for PCT Application No. PCT/JP2020/040670, mailed on Dec. 8, 2020.
(Continued)

*Primary Examiner* — Erin M Piateski
*Assistant Examiner* — Michael T Dowling
(74) *Attorney, Agent, or Firm* — Sughrue Mion, PLLC

(57) ABSTRACT

A motion estimation apparatus includes: a motion analyzing unit that generates first motion analysis data representing actual motion of a mobile object in a first environment; an environment analyzing unit that analyzes the first environment based on environment state data representing a state of the first environment, and generates environment analysis data; an estimation unit that inputs the environment analysis data to a model for estimating motion of a mobile object in the first environment, and estimates the motion of the mobile object in the first environment; and a learning instruction unit that sets a confidence interval, based on the motion estimation result data estimated by the model, and if the first motion analysis data is not in the set confidence interval, instructing a learning unit that learns the model to relearn the model.

14 Claims, 14 Drawing Sheets

(51) Int. Cl.
*G01C 21/16* (2006.01)
*G06F 30/27* (2020.01)

(58) Field of Classification Search
USPC ........................................................ 701/411
See application file for complete search history.

(56) References Cited

U.S. PATENT DOCUMENTS

| | | | | |
|---|---|---|---|---|
| 2018/0189565 | A1 | 7/2018 | Lukierski et al. | |
| 2019/0311272 | A1 | 10/2019 | Kamata et al. | |
| 2020/0133998 | A1 | 4/2020 | Ito et al. | |
| 2021/0354729 | A1* | 11/2021 | Ng .................... | B60W 30/0956 |
| 2022/0126864 | A1* | 4/2022 | Moustafa ........... | B60W 60/0011 |

FOREIGN PATENT DOCUMENTS

| | | | | |
|---|---|---|---|---|
| JP | 2017-227656 | A | | 12/2017 |
| JP | 2018-529175 | A | | 10/2018 |
| JP | 2019-182093 | A | | 10/2019 |
| JP | 2019-529898 | A | | 10/2019 |
| JP | 2020-013480 | A | | 1/2020 |
| JP | 2020-027432 | A | | 2/2020 |
| JP | 2020-067980 | A | | 4/2020 |
| JP | 2020-086960 | A | | 6/2020 |
| KR | 20100071376 | A | * | 6/2010 |
| WO | 2019/176354 | A1 | | 9/2019 |

OTHER PUBLICATIONS

JP Office Action for JP Application No. 2022-558717, mailed on Oct. 24, 2023 with English Translation.

International Search Report for PCT Application No. PCT/JP2020/040670, mailed on Dec. 8, 2020.

Bo Zhou et al., "Probabilistic Terrain Modeling of Mobile Robots for Outdoor Applications Using a Scanning Laser", 2012 IEEE International Conference on Mechatronics and Automation, Aug. 2012, pp. 1716-1721.

Ruyi Zhou et al., "Mapping for Planetary Rovers from Terramechanics Perspective", 2019 IEEE/RSJ International Conference on Intelligent Robots and Systems (IROS), Nov. 2019, pp. 1869-1874.

Junya Morimoto et al., "Study of the Path Planning Based on SLAM and Semantic Segmentation by Deep Learning for Forest Environmental Monitoring Robot", Visual/Media Computing Conference 2018, Preprints of the 46th Annual Conference of the Institute of Image Electronics Engineers of Japan, 2018, pp. 1-4.

P. Fankhauser et al., "Probabilistic Terrain Mapping for Mobile Robots with Uncertain Localization", IEEE Robotics and Automation Letters, Oct. 2018, vol. 3, No. 4, pp. 3019-3026.

Akinobu Fujii et al., "Automatic map update system based on the probability of deviation occurrence between the map and the measured value", Proceedings of the 35th Annual Conference of the RSJ, Sep. 2017, AC1H1-03, pp. 1-4.

Ditebogo Masha et al., "Slip estimation methods for proprioceptive terrain Classification using Tracked Mobile Robots", 2017 Pattern Recognition Association of South Africa and Robotics and Mechatronics International Conference (PRASA-RobMech), 2017, pp. 150-152.

* cited by examiner

MOTION ESTIMATION APPARATUS, MOTION ESTIMATION METHOD, PATH GENERATION APPARATUS, PATH GENERATION METHOD, AND COMPUTER-READABLE RECORDING MEDIUM

This application is a National Stage Entry of PCT/JP2020/040670 filed on Oct. 29, 2020, the contents of all of which are incorporated herein by reference, in their entirety.

TECHNICAL FIELD

The present invention relates to a motion estimation apparatus, a motion estimation method, a path generation apparatus, and a path generation method that are used to estimate motion of a mobile object, and further relates to a computer-readable recording medium having recorded thereon a program for realizing the apparatuses and methods.

BACKGROUND ART

Recently, natural disasters frequently occur, and people have to work in dangerous environments in disaster areas. In view of this, efforts have been taken to autonomize work vehicles and the like used in such dangerous environments.

In dangerous environments such as disaster-stricken areas, however, it is difficult to accurately estimate motion of work vehicles. In other words, it is difficult to cause work vehicles to autonomously travel, perform work, and the like in correspondence with the dangerous environments.

The reason for that is because it is difficult to obtain, in advance, data regarding dangerous environments such as disaster-stricken areas, in other words, unknown environments such as irregular outdoor terrain that is not maintained.

In view of this, a technique is known in which motion of a work vehicle in an unknown environment is estimated by inputting motion analysis data of the work vehicle obtained in the unknown environment into a model for estimating motion of a work vehicle.

Also, as a related technique, Patent Document 1 discloses a motion estimation apparatus for determining whether it is necessary to update a motion estimation model database. According to the motion estimation apparatus, if it is determined that there is a deviation between the actual motion of a mobile object that is present in the surroundings of a work vehicle (the vehicle) and motion of the mobile object estimated by the motion estimation model, the motion estimation apparatus estimates the reason of the deviation, and updates the motion estimation model database based on the estimated reason.

LIST OF RELATED ART DOCUMENTS

Patent Documents

Patent Document 1: Japanese Patent Laid-Open Publication No. 2019-182093

SUMMARY

Technical Problems

However, in the above-described technique for estimating motion of a work vehicle in an unknown environment, when new motion analysis data is obtained while the work vehicle is traveling or operating, the work vehicle transitions to a mode for relearning a model.

Accordingly, in order to improve the accuracy of motion estimation and ensure the safety of the work vehicle, the work vehicle needs to stop traveling or operating each time new motion analysis data is obtained. The work vehicle thus cannot be efficiently operated.

Also, since the motion estimation apparatus disclosed in Patent Document 1 is an apparatus for estimating motion of a mobile object that is present in the surroundings of a work vehicle (the vehicle), motion of the work vehicle in an unknown environment cannot be estimated.

An example object of the invention is to provide a motion estimation apparatus, a motion estimation method, a path generation apparatus, a path generation method, and a computer-readable recording medium that improve the operation efficiency of a mobile object by reducing the number of times of relearning a model in an unknown environment.

Solution to the Problems

In order to achieve the example object described above, a motion estimation apparatus according to an example aspect includes:

a motion analyzing unit that generates first motion analysis data representing actual motion of a mobile object in a first environment;

an environment analyzing unit that analyzes the first environment based on environment state data representing a state of the first environment, and generates environment analysis data;

an estimation unit that inputs the environment analysis data to a model for estimating motion of a mobile object in the first environment, and estimates the motion of the mobile object in the first environment; and a learning instruction unit that sets a confidence interval, based on the motion estimation result data estimated by the model, and if the first motion analysis data is not in the set confidence interval, instructing a learning unit that learns the model to relearn the model.

Also, in order to achieve the example object described above, a path generation apparatus according to an example aspect includes:

a motion analyzing unit that generates first motion analysis data representing actual motion of a mobile object in a first environment;

an environment analyzing unit that analyzes the first environment, based on environment state data representing a state of the first environment, and generates environment analysis data;

an estimation unit that inputs the environment analysis data to a model for estimating motion of a mobile object in the first environment and estimates the motion of the mobile object in the first environment;

a learning instruction unit that sets a confidence interval, based on the motion estimation result data estimated by the model, and if the first motion analysis data is not in the set confidence interval, instructing a learning unit that learns the model to relearn the model, and a path generating unit that, if the model is relearned, regenerating path data representing a path from a current position to a destination, based on motion estimation result data generated using the relearned model.

Also, in order to achieve the example object described above, a motion estimation method according to an example aspect includes:

generating first motion analysis data representing actual motion of a mobile object in a first environment;

analyzing the first environment based on environment state data representing a state of the first environment, and generating environment analysis data;

inputting the environment analysis data to a model for estimating motion of a mobile object in the first environment, and estimating the motion of the mobile object in the first environment; and setting a confidence interval, based on the motion estimation result data estimated by the model, and if the first motion analysis data is not in the set confidence interval, instructing a learning unit that learns the model to relearn the model.

Also, in order to achieve the example object described above, a path generation method according to an example aspect includes:

generating first motion analysis data representing actual motion of a mobile object in a first environment;

analyzing the first environment, based on environment state data representing a state of the first environment, and generating environment analysis data;

inputting the environment analysis data to a model for estimating motion of a mobile object in the first environment and estimating the motion of the mobile object in the first environment;

setting a confidence interval based on the motion estimation result data estimated from the model, and if the first motion analysis data is not in the set confidence interval, causing a learning unit that learns the model to relearn the model; and if the model is relearned, regenerating path data representing a path from a current position to a destination, based on motion estimation result data generated using the relearned model.

Also, in order to achieve the example object described above, a computer-readable recording medium according to an example aspect includes a program recorded on the computer-readable recording medium, the program including instructions that cause the computer to carry out:

generating first motion analysis data representing actual motion of a mobile object in a first environment;

analyzing the first environment based on environment state data representing a state of the first environment, and generating environment analysis data;

inputting the environment analysis data to a model for estimating motion of a mobile object in the first environment, and estimating the motion of the mobile object in the first environment; and setting a confidence interval, based on the motion estimation result data estimated by the model, and if the first motion analysis data is not in the set confidence interval, instructing a learning unit that learns the model to relearn the model.

Furthermore, in order to achieve the example object described above, a computer-readable recording medium according to an example aspect includes a program recorded on the computer-readable recording medium, the program including instructions that cause the computer to carry out:

generating first motion analysis data representing actual motion of a mobile object in a first environment;

analyzing the first environment, based on environment state data representing a state of the first environment, and generating environment analysis data;

inputting the environment analysis data to a model for estimating motion of a mobile object in the first environment and estimating the motion of the mobile object in the first environment;

setting a confidence interval based on the motion estimation result data estimated from the model, and if the first motion analysis data is not in the set confidence interval, causing a learning unit that learns the model to relearn the model; and if the model is relearned, regenerating path data representing a path from a current position to a destination, based on motion estimation result data generated using the relearned model.

Advantageous Effects of the Invention

As an example aspect, it is possible to improve the operation efficiency of a mobile object by reducing the number of times of relearning a model in an unknown environment.

EXAMPLE EMBODIMENTS

Figure 1:
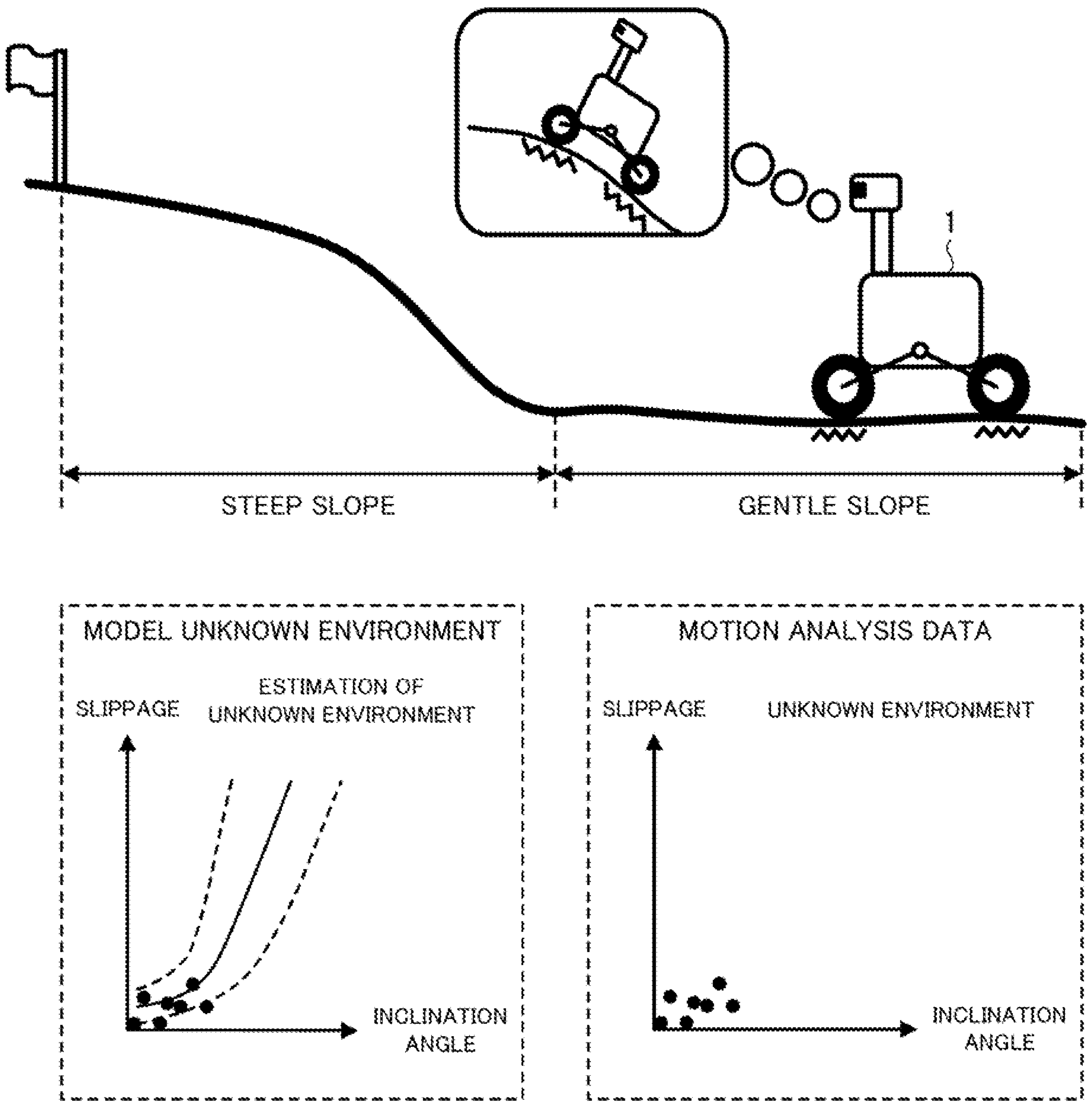
FIG. 1 is a diagram illustrating a relationship between an inclination angle and slippage in an unknown environment.

First, an outline will be described for facilitating understanding of the example embodiments described below.

Conventionally, an autonomous work vehicle that operates in unknown environments such as disaster-stricken areas, construction sites, mountain forests, and other planets obtains image data obtained by capturing images of the unknown environment from an image capturing device mounted in the work vehicle, performs image processing on the obtained image data, and estimates the state of the unknown environment based on the result of the image processing.

However, the state of the unknown environment cannot be accurately estimated only from the image data. For this reason, it is difficult to estimate motion of a work vehicle, and cause a work vehicle to travel and operate in unknown environments.

Here, "the state of the unknown environment" means the state of an environment in which the topography, the type of ground, the state of the ground and the like are unknown, for example. "The type of ground" means, for example, the type of soil categorized by content ratio of gravel, sand, clay, silt, and the like. Also, "the type of ground" may include ground where plants grow, ground made of concrete, rock, or the like, and ground where obstacles are present, for example. "The state of the ground" means, for example, the moisture content of the ground, the looseness (solidness) of the ground, the geological formation, and the like.

Also, in recent years, it has been proposed that image data captured in the past in various environments is set to training data, a model for estimating a path on which the vehicle will travel is learned, and the path on which the vehicle will travel is estimated using the learned model.

However, the training data lacks image data of the unknown environment and data regarding topography that is highly risky for the work vehicle, such as steep slopes or pooled water. Accordingly, learning of the model is insufficient. For this reason, if the model which is insufficiently learned is used, it is difficult to accurately estimate travel of the work vehicle.

In view of this, it is proposed that a model is learned using the motion analysis data generated in an unknown environment and the motion analysis data generated for each of the environments in which the vehicle traveled in the past, and the motion of a work vehicle is accurately estimated by inputting the environment analysis data in which the state of the unknown environment is analyzed into the generated model to estimate motion of a work vehicle in an unknown environment.

However, in the above-described proposal, since a model is relearned each time the work vehicle obtains the motion analysis data in order to improve the estimation accuracy, the work vehicle cannot be efficiently operated. Specifically, when the work vehicle obtains the motion analysis data while the work vehicle is traveling or operating, the work vehicle has to stop the traveling or operation to relearn a model in order to ensure the improvement in accuracy of motion estimation and safety for the work vehicle.

Through such processes, the inventors found a problem that the operation efficiency of the work vehicle decreases when motion of a vehicle is accurately estimated in an unknown environment by methods such as described above. In addition, the inventors have found a means to solve the problem.

In other words, the inventors derived a means for decreasing the number of times of relearning of a model in an unknown environment. As a result, motion of a mobile object such as a work vehicle can be accurately estimated, and decrease in the operation efficiency of a work vehicle can be suppressed.

Hereinafter, estimation of motion of a mobile object will be described with reference to the drawings. In the drawings described below, elements having identical or corresponding functions will be assigned the same reference signs, and redundant descriptions thereof may be omitted.

Figure 2:
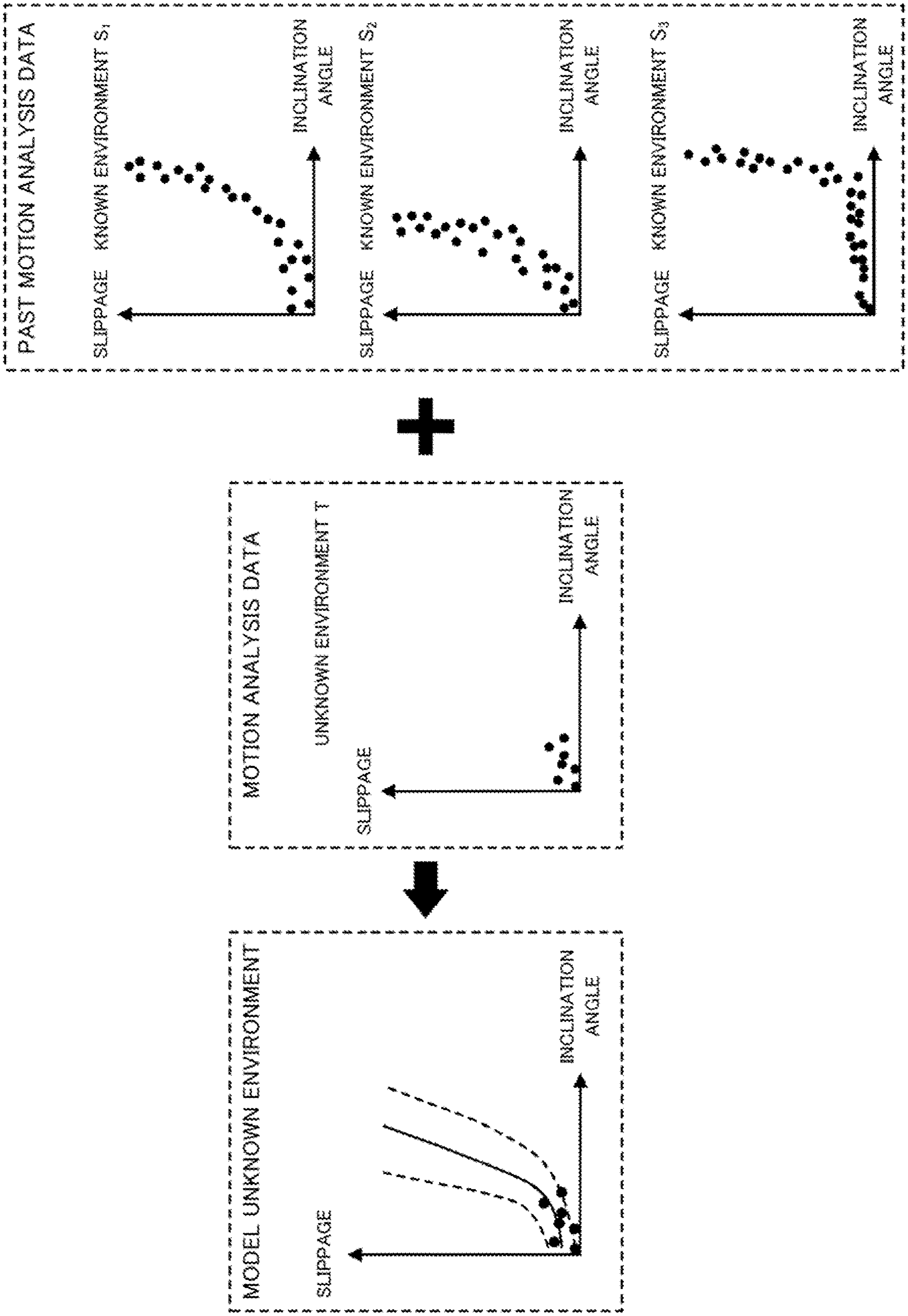
FIG. 2 is a diagram illustrating estimation of slippage on a steep slope in an unknown environment.

Estimation of motion of a mobile object (slippage of a work vehicle 1) will be described using FIGS. 1 and 2. FIG. 1 is a diagram illustrating a relationship between an inclination angle and slippage in an unknown environment. FIG. 2 is a diagram illustrating estimation of slippage on a steep slope in an unknown environment.

First, a work vehicle 1, which is a mobile object shown in FIG. 1, obtains mobile object state data indicating the state of the mobile object from sensors for measuring the state of the work vehicle 1 while traveling in an unknown environment, and stores the obtained mobile object state data in a storage device provided inside or outside of the work vehicle 1.

Next, the work vehicle 1 analyzes the mobile object state data obtained from the sensors, in a gentle slope with a low risk in the unknown environment, to obtain motion analysis data indicating a relationship between the inclination angle of the gentle slope and slippage of the work vehicle 1. Images of motion analysis data are as shown in the graphs in FIGS. 1 and 2.

Next, the work vehicle 1 learns a model regarding the slippage on a steep slope in order to estimate the slippage of the work vehicle 1 on the steep slope shown in FIG. 1. Specifically, the work vehicle 1 learns a model for estimating slippage of the work vehicle 1 using the motion analysis data on a gentle slope with a low risk in the unknown environment, and a plurality of pieces of past motion analysis data.

The plurality of pieces of past motion analysis data can be represented with an image as in the graphs in FIG. 2. For example, if the known environments are $S_1$ (cohesive soil), $S_2$ (sandy soil), and $S_3$ (rock), the plurality of pieces of past motion analysis data are data indicating the relationship between the inclination angle and the slippage, that is generated by analyzing the mobile object state data in the respective environments. Note that the plurality of pieces of past motion analysis data are stored in the storage device.

In the example shown in FIG. 2, the work vehicle 1 learns a model using the motion analysis data generated based on the mobile object state data measured on a gentle slope in an unknown environment and the past motion analyzing data generated in the respective known environments $S_1$, $S_2$, and $S_3$.

Next, slippage of the work vehicle on a steep slope in an unknown environment is estimated using the learned model. Specifically, on the gentle slope with a low risk in the unknown environment, the work vehicle 1 analyzes the environment state data indicating the state of the steep slope obtained by the work vehicle 1 from the sensors to generate environment analysis data indicating topographic shape and the like.

Next, the work vehicle 1 inputs the environment analysis data to a model for estimating the motion of the mobile object in the target environment to estimate the slippage of the work vehicle 1 on the steep slope in the target environment.

By doing so, motion of a mobile object can be accurately estimated in an unknown environment. Accordingly, a mobile object can be accurately controlled even in an unknown environment.

EXAMPLE EMBODIMENT

Figure 3:
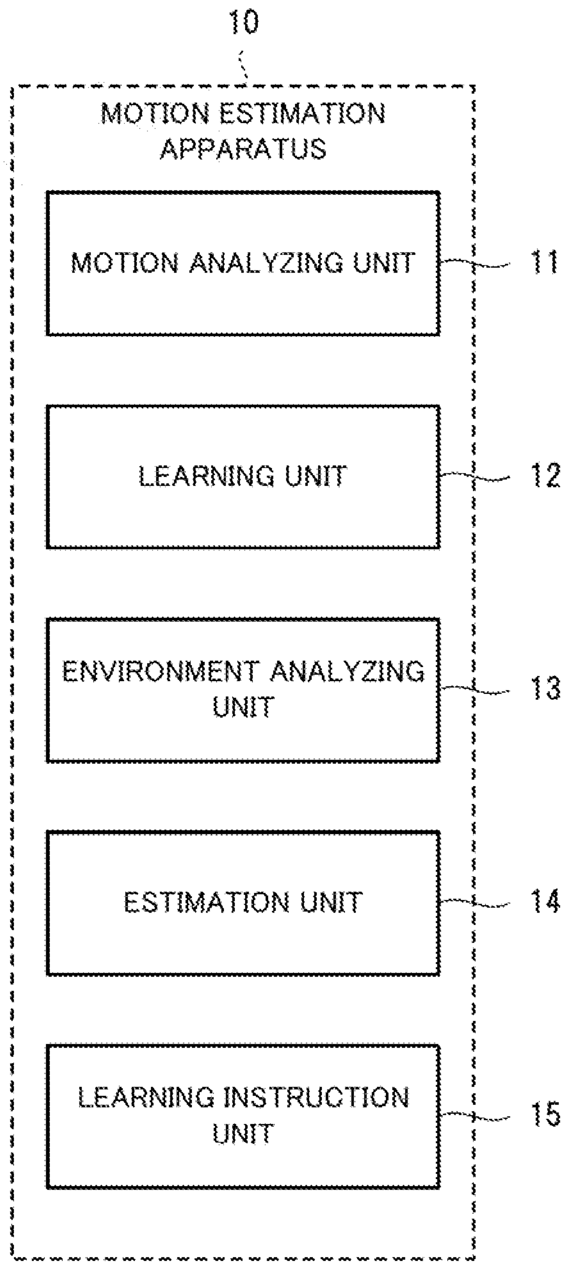
FIG. 3 is a diagram illustrating an example of a motion estimation apparatus.

Hereinafter, an example embodiment will be described with reference to the drawings. The configuration of a motion estimation apparatus 10 in the example embodiment will be described using FIG. 3. FIG. 3 is a diagram illustrating an example of a motion estimation apparatus.

[Configuration of Motion Estimation Apparatus]

The motion estimation apparatus 10 shown in FIG. 3 is an apparatus for learning a model used for accurately estimating the motion of a mobile object in an unknown environment. As shown in FIG. 3, the motion estimation apparatus 10 includes a motion analyzing unit 11, a learning unit 12, an environment analyzing unit 13, an estimation unit 14, and a learning instruction unit 15.

The motion estimation apparatus 10 is a circuit or an information processing apparatus on which a programmable device such as a CPU (Central Processing Unit), an FPGA (Field-Programmable Gate Array), a GPU (Graphics Processing Unit) is mounted, or on which all thereof or two or more thereof are mounted, for example.

The motion analyzing unit 11 generates motion analysis data (first motion analysis data) indicating actual motion of a mobile object in a target environment (first environment: unknown environment). Specifically, the motion analyzing unit 11 analyzes motion of the mobile object based on the mobile object state data indicating the state of the mobile object to generate the motion analysis data indicating motion of a mobile object.

The target environment is an unknown environment in which a mobile object moves in a disaster-stricken area, a construction site, a mountain forest, and another planet, for example.

The mobile object is, for example, a vehicle, a ship, an aircraft, a robot, or the like that is autonomous. If the mobile object is a work vehicle, the work vehicle is a construction vehicle used for operation in a disaster-stricken area, a construction site or a mountain forest, an exploration vehicle used for exploration on another planet, or the like.

The mobile object state data is data indicating the state of a mobile object obtained from a plurality of sensors for measuring the state of the mobile object. If the mobile object is a vehicle, the sensors for measuring the state of the mobile object are, for example, positional sensors for measuring the position of the vehicle, IMUs (Inertial Measurement Units: triaxial gyrosensor plus triaxial angular velocity sensor), wheel encoders, measurement instruments for measuring power consumption or fuel consumption, or the like.

The motion analysis data is data indicating the moving speed, the attitude angle, and the like of a mobile object, generated using the mobile object state data. If the mobile object is a vehicle, the motion analysis data is data indicating, for example, the traveling speed, wheel rotation speed, and attitude angle of the vehicle, slippage during traveling, vibration of the vehicle while traveling, the power consumption, the fuel consumption, and the like.

The environment analyzing unit 13 analyzes the target environment based on the environment state data indicating the state of the target environment, and generates the environment analysis data.

The environment state data is data indicating the state of the target environment, obtained from the plurality of sensors for measuring the state of the surrounding environment (target environment) of the mobile object. If the mobile object is a vehicle, the sensors for measuring the state of the target environment are LiDARs (Light Detection and Ranging, Laser Imaging Detection and Ranging), image capturing devices, or the like, for example.

The LiDARs generate three-dimensional point cloud data of the surroundings of the vehicle, for example. The image capturing devices are, for example, cameras for capturing images of the target environment, and output image data (moving images or still images). Also, sensors provided outside of the mobile object, for example, sensors provided in aircrafts, drones, artificial satellites, or the like may be used for the sensors for measuring the state of the target environment.

The environment analysis data is data that is generated using the environment state data and indicates the state of the target environment. If the mobile object is a vehicle, the environment state data is, for example, data indicating the topographic shape such as inclination angles and unevenness. Note that three-dimensional point cloud data, image data, three-dimensional map data or the like may be used as the environment state data.

The estimation unit 14 inputs the environment analysis data to a model for estimating motion of the mobile object in the target environment and estimates the motion of the mobile object in the target environment. The model is a model that is generated by the learning unit 12 (described later) and is for estimating motion of a mobile object such as the work vehicle 1 in an unknown environment.

The learning unit 12 uses the motion analysis data (first motion analysis data) generated in the target environment (first environment) and the motion analysis data (second motion analysis data) generated in respective known environments (second environments) in the past, to calculate the similarity between the target environment and the known environments. After that, the learning unit 12 uses the calculated similarity and the models learned in the respective known environments, to learn a model for estimating the motion of the mobile object in the target environment.

Generation of a model will be described now.

The model is a model used for estimating the motion of the mobile object such as the work vehicle 1 in an unknown environment. The model can be represented by a function as shown in Expression 1.

[Expression 1]

$$f^{(T)}(x*|D,\theta)=f^{(S_i,T)}\left(x*\,\middle|\,D^{(T)},D^{(S_i)},\theta^{(T)},\theta^{(S_i)}\right) \quad (1)$$

$$D=\left\{D^{(T)},D^{(S_1)},\ldots\ D^{(S_N)}\right\}$$

$$\theta=\left\{\theta^{(T)},\theta^{(S_1)},\ldots\ \theta^{(s_N)}\right\}$$

$$D^{(T)}=\left\{X_j^{(T)},Y_j^{(T)}\right\}$$

$$D^{(S_i)}=\left\{X_j^{(S_i)},Y_j^{(S_i)}\right\}$$

$$\theta^{(T)}=\left\{\theta_1^{(T)},\ldots,\theta_P^{(t)}\right\}$$

$$\theta^{(S_i)}=\left\{\theta_i^{(S_i)},\ldots,\theta_P^{(S_i)}\right\}$$

T: symbol representing the target environment (unknown environment) (target domain)

$S_i$: symbol representing the i-th known environment (source domain)

i: 1 to N (integer of 2 or more)

$f$: model x*: estimated point x: input (feature amount)

D: motion analysis data of target environment and known environment $D^{(T)}$: set of motion analysis data in the target environment $D^{(S_i)}$: set of motion analysis data in i-th known environment X: set of input values x in motion analysis data, for example, set of inclination angles Y: set of observed values y in the motion analysis data, for example, set of slippage values j: 1 to M (integer of 2 or more)

θ: vector composed of P model parameters and hyperparameters $\theta^{(T)}$: vector composed of model parameters and hyperparameters for the target environment $\theta^{(S_i)}$: vector composed of model parameters and hyperparameters for the i-th known environment The N Gaussian process regression models $$f_G^{(Si)}$$

represented by Expression 2 combined with the weighted linear sum is an example of a model to which Expression 1 is applied. The Gaussian process regression models construct a model based on the motion analysis data. Also, the Gaussian process regression models learns a weight $w_i$ shown in Expression 2. The weight $w_i$ is a model parameter indicating the similarity between the motion analysis data corresponding to the target environment and the motion analysis data corresponding to a known environment.

[Expression 2]

$$f_G^{(T)}(x_G^* \mid D, \theta) = \sum_{i=1}^{N} g(w_i) \cdot f_G^{(S_i)}(x_G^* \mid D^{(T)}, D^{(S_i)}, \theta^{(T)}, \theta^{(S_i)}) \quad (2)$$

$w_i$: similarity between motion analysis data of the target environment and motion analysis data of the i-th known environment g: any function monotonic on $w_i$ $$f_G^{(S_i)}$$

function that changes according to motion analysis data corresponding to the target environment Further, the N linear regression models $$f_G^{(S_i)}$$

represented by Expression 3 combined with the weighted linear sum is an example of another model. The linear regression model constructs a model based on a learned model generated for each of the plurality of known environments in the past.

[Expression 3]

$$f_G^{(T)}(x_G^* \mid D, \theta) = \sum_{i=1}^{N} g(w_i) \cdot f_G^{(S_i)}(x_G^* \mid \theta^{(S_i)}) \quad (3)$$

$$f_G^{(S_i)}$$

function that does not change with motion analysis data corresponding to the target environment A learning instruction unit 15 sets a confidence interval based on the motion estimation result data estimated by the model, and if the first motion analysis data is not in the set confidence interval, the learning instruction unit 12 instructs the learning unit 12 to relearn the model.

Figure 4:
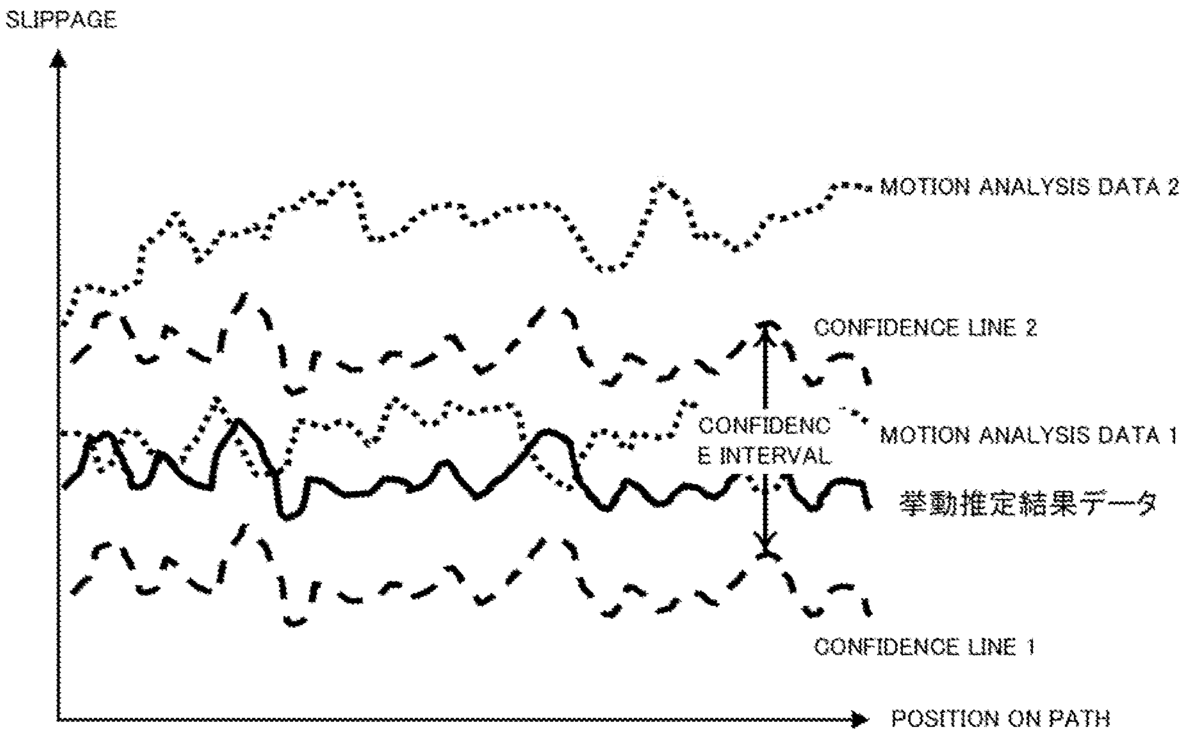
FIG. 4 is a diagram illustrating relearning of a model.

This will be specifically described using FIG. 4. FIG. 4 is a diagram illustrating relearning of a model. In FIG. 4, first, the learning instruction unit 15 obtains the motion estimation result data with respect to slippage of the work vehicle 1 estimated by the estimation unit 14 using a model. Next, the learning instruction unit 15 sets the confidence interval based on the obtained motion estimation result data.

In the example shown in FIG. 4, the confidence interval is set by confidence lines 1 and 2 (dotted lines) with the motion estimation result data (solid line) as the center. The width of the confidence interval (interval between the confidence line 1 and the confidence line 2 including the motion estimation result data) is determined through experiments, simulations, or the like, for example, and stored in advance in the storage unit. Note that the width between the motion estimation result data and the confidence line 1 need not necessarily be the same as the width between the motion estimation result data and the confidence line 2.

Note that, if modelization is performed based on the Gaussian process, in addition to the mean value of estimation corresponding to the solid line in FIG. 4, the variance value can be estimated. In this case, the mean ±a* variance is set as the confidence interval. a is a coefficient that is defined in advance. For example, if the prediction model is correct when a=1.96, 95% of the motion estimation data falls within the confidence interval.

Specifically, if a=1.64, 90[%] is set as the confidence interval. If a=2.58, 99 [%] is set as the confidence interval. Note that examples of the method for determining the coefficient a include perception of experts, experiments, and simulations.

Next, the learning instruction unit 15 determines whether the motion analysis data is in the set confidence interval. If the motion analysis data is not in the set confidence interval, the learning instruction unit 15 instructs the learning unit 12 to relearn the model. On the other hand, if the motion analysis data is in the set confidence interval, the learning instruction unit 15 does not instruct the learning unit 12 to relearn the model.

In the example of FIG. 4, since the actual motion analysis data 1 (dotted line) of the mobile object generated in the target environment is present in the confidence interval, the learning instruction unit 15 does not instruct the learning unit 12 to relearn the model. On the other hand, if motion analysis data 2 (dotted line) is not in the confidence interval, the learning instruction unit instructs the learning unit 12 to relearn (update) the model.

Note that whether the motion analysis data is in the confidence interval need not be determined based on only data at a single time. Such determination may be performed by determining whether 90 [%] or more of the motion analysis data analyzed in a predetermined range (e.g., last 10 [m]) is included in the confidence interval.

[System Configuration]

Figure 5:
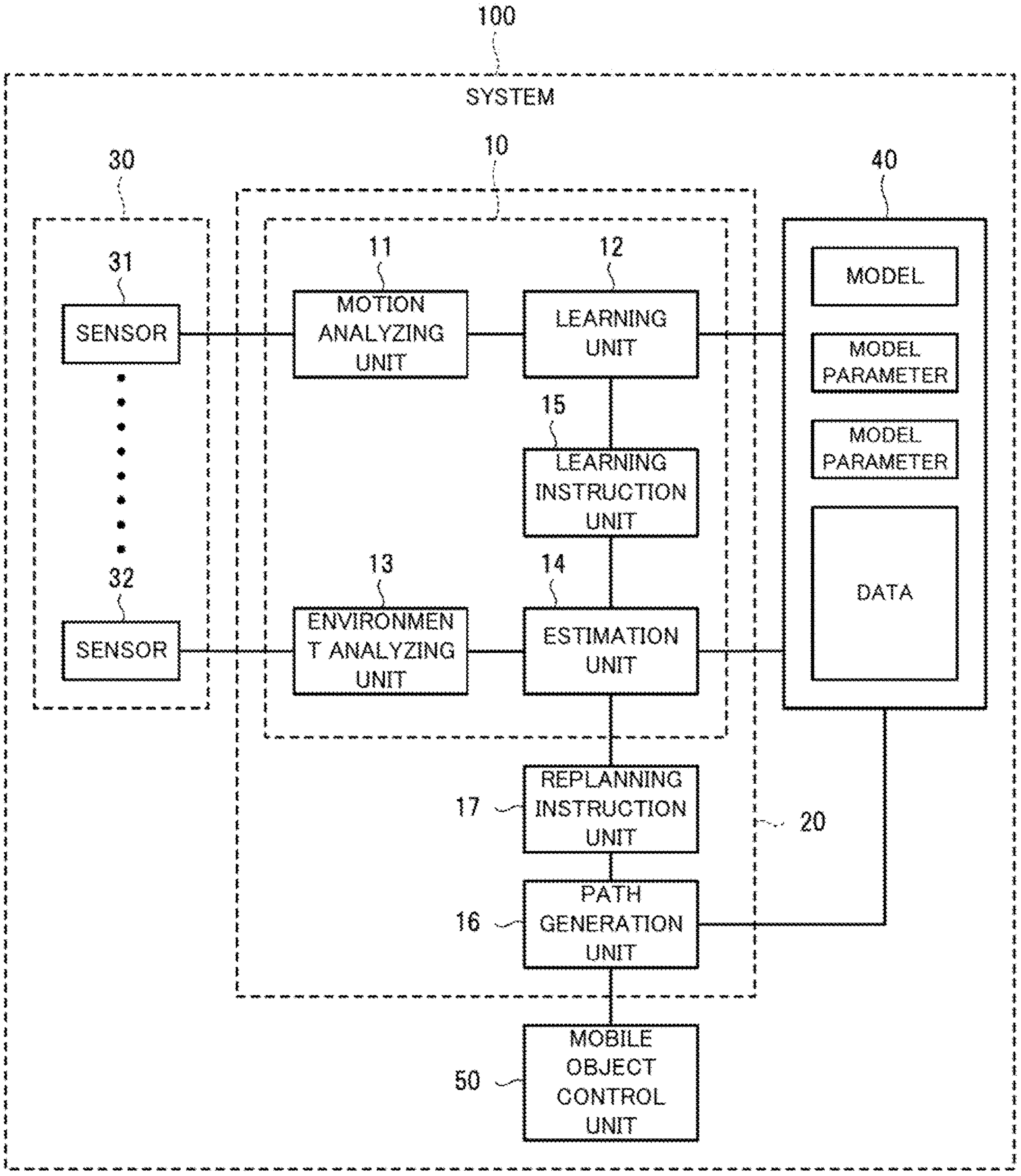
FIG. 5 is a diagram illustrating an example of a system including a behaviormotion estimation apparatus.

Next, the configuration of system 100 system in the present example embodiment will be described using FIG. 5. FIG. 5 is a diagram illustrating an example of a system including a motion estimation apparatus.

The system 100 shown in FIG. 5 is a system for planning the path and controlling the movement in an unknown environment. As shown in FIG. 5, the system 100 includes a path generation apparatus 20, a measurement unit 30, a storage device 40, and a mobile object control unit 50. The path generation apparatus 20 includes a motion estimation apparatus 10, a path generation unit 16, and replanning instruction unit 17.

The measurement unit 30 includes sensors 31 and sensors 32. The sensors 31 are sensors for measuring the state of the above-described mobile object. The sensors 32 are sensors for measuring the state of the surrounding environment (target environment) of the above-described mobile object.

The sensors 31 measure the state of the mobile object and output the measured mobile object state data to the motion analyzing unit 11. The sensors 31 include a plurality of sensors. If the mobile object is a vehicle, the sensors 31 are, for example, positional sensors for measuring the position of the vehicle, IMUs, wheel encoders, measurement instruments for measuring power consumption or fuel consumption, or the like. The positional sensors are, for example, GPS (Global Positioning System) receivers. The IMUs measure the acceleration of the vehicle in the triaxial (XYZ axes) directions and the triaxial angular velocity of the vehicle. The wheel encoders measure the rotational speed of the wheels.

The sensors 32 measure the state of the surrounding environment (target environment) of the mobile object and output the measured environment state data to the environment analyzing unit 13. The sensors 32 include a plurality of sensors. If the mobile object is a vehicle, the sensors 32 are, for example, LiDARs, image capturing devices, and the like. Also, the sensors for measuring the state of the target environment may be sensors provided outside of the mobile object, for example, sensors provided in aircrafts, drones, artificial satellites, or the like.

First, the motion analyzing unit 11 obtains the mobile object state data measured by each of the sensors included in the sensors 31 in the target environment. Next, the motion analyzing unit 11 analyzes the obtained mobile object state data to generate motion analysis data (first motion analysis data) indicating the motion of the mobile object. Next, the motion analyzing unit 11 outputs the generated first motion analysis data to the learning unit 12.

First, the learning unit 12 obtains the first motion analysis data that is output from the motion analyzing unit 11 and second motion analyzing data that is generated in the respective known environments and stored in the storage device 40. Next, the learning unit 12 learns the model indicated in Expressions 2, 3, and the like, using the obtained first motion analysis data and the second motion analysis data. Next, the learning unit 12 stores model parameters generated through the learning, in the storage device 40.

Also, the learning unit 12 may learn a model using the first motion analysis data, second motion analysis data generated for each second environment, and the similarity of geological feature for each position in the first environment and the second environments.

With regard to geological feature, it is highly possible that the geological features of the positions that are close to each other are similar, while those of the distant positions are different. In view of this, due to further learning using the similarity of geological features in learning of the model, the accuracy of motion estimation can be improved. The model can be represented by the function as in Expression 4.

[Expression 4]

$$f^{(T)}(x^* \mid D, \theta) = f_G^{(T)}(x_G^* \mid X_G, Y, \theta_G) \cdot f_P^{(T)}(x_P^* \mid X_P, Y, \theta_P) \tag{4}$$

$$f_P^{(T)}$$

A model that represents the relationship between geological features (running motion) according to position $$x_G^*$$

topographic information of prediction points $$x_P^*$$

positional information of prediction points $X_G$: A set of input values $x_G$ related to topographic information among motion analysis data $X_P$: A set of input values $x_P$ related to position information among motion analysis data $\theta_G$: A vector consisting of model parameters and hyperparameters related to the function $$f_G^{(T)}$$

with topographic information as input among $\theta$ $\theta_P$: A vector consisting of model parameters and hyperparameters related to the function $$f_P^{(T)}$$

with position information as input among $\theta$

As represented in Expression 4, due to modulization with the motion estimation model $f_G$ based on the topographic information and a model $f_P$ related to the relationship between the position and geological features (motion) being explicitly divided, the accuracy of motion estimation in a place where the vehicle travels can be improved. Specifically, information relating to topography information is input to the motion estimation model $f_G$ to perform motion estimation. Also, the model $f_P$ performs motion estimation by inputting the position and geological features as the positional information.

When information relating to inclination angle and unevenness is input to the motion estimation model $f_G$ as the topographic information, if the topography in the front is the same as the front of the path ahead, motion is estimated on the assumption that the vehicle travels in the same manner. However, even if the inclination angle $x_G$, that is the input value, is the same, in actuality, the traveling motion may be different depending on how far the position of interest is from a position where the motion analysis data used for learning was obtained.

However, since use of the model $f_P$ makes it possible to supplement the difference in traveling motion depending on the position as describe above, motion estimation can be performed more accurately.

Note that the model $f_G$ and the model $f_P$ are modelled through the Gaussian process regression, linear regression, or the like, for example. Also, the estimation results of the models may be multiplied with each other after learning the model $f_G$ and the model $f_P$ separately. Also, the learning may be performed in the form of $f_G \cdot f_P$. Also, in Expression 4, modelization is performed in the form of the product of $f_G$ and $f_P$ as an example, the modelization may also be performed in the form of the sum of $f_G$ and $f_P$.

First, the environment analyzing unit 13 obtains the environment state data measured by each of the sensors included in the sensors 32 in the target environment. Next, the environment analyzing unit 13 analyzes the obtained environment state data to generate the environment analysis data indicating the state of the environment. Next, the environment analyzing unit 13 outputs the generated environment analysis data to the estimation unit 14. Also, the environment analyzing unit 13 may store the environment analysis data in the storage device 40.

First, the estimation unit 14 obtains the environment analyzing data that is output from the environment analyzing unit 13, the model parameters, the hyperparameters, and the like stored in the storage device 40. Next, the estimation unit 14 inputs the obtained environment analysis data, model parameters, hyperparameters and the like, to the model for estimating the motion of the mobile object in the target environment, to estimate the motion of the mobile object in the target environment. The estimation unit 14 may also store the motion estimation result data in the storage device 40.

The storage device 40 is a memory for storing various kinds of data handled in the system 100. Various kinds of data include models, model parameters, hyper parameters, first motion analysis data (e.g., new motion analysis data obtained by analyzing in an unknown environment), second motion analysis data (e.g., a plurality of motion analysis data obtained by analyzing in known environments in the past), the environment analysis data, the motion estimation result data, and the like. In the example in FIG. 5, the storage device 40 is provided in the system 100. However, the storage device 40 may be provided separately from the system 100. In this case, the storage device 40 may conceivably be a storage device such as a database, a server computer, or the like.

First, the learning instruction unit 15 obtains the motion estimation result data from the estimation unit 14. Next, the learning instruction unit 15 sets the confidence interval based on the obtained motion estimation result data. Next, the learning instruction unit 15 determines whether the motion analysis data is in the set confidence interval. If the motion analysis data is in the set confidence interval, the learning instruction unit 15 does not instruct the learning unit 12 to relearn the model. If the motion analysis data is not in the set confidence interval, the learning instruction unit 15 instructs the learning unit 12 to relearn the model.

The path generation unit 16 generates the path data representing the path from the current position to the destination, based on the result of estimating the motion of the mobile object in the target environment (motion estimation result data). Generation of the path data will be described later.

Also, if the path generation unit 16 obtains the instruction for replanning from the replanning instruction unit 17, the path generation unit 16 generates the path data representing the path from the current position to the destination based on the motion estimation result data of the relearned model.

The replanning instruction unit 17 obtains the motion estimation result data from the estimation unit 14. Next, the replanning instruction unit 17 determines whether the path data (replan) is to be generated, based on the obtained motion estimation result data. If it is determined that replanning is to be performed, the replanning instruction unit 17 instructs the path generation unit 16 to generate the path data. Also, if it is determined that replanning is not to be performed, the replanning instruction unit 17 does not instruct the path generation unit 16 to generate the path data.

Specifically, when the model is relearned, the replanning instruction unit 17 instructs the path generation unit 16 to generate the path data. Also, when the path needs to be modified even if the model is not relearned, the replanning instruction unit 17 instructs the path generation unit 16 to generate the path data. For example, when an obstacle is detected on the planned path, when the mobile object significantly deviates from the planned path, or the like, the replanning instruction unit 17 instructs the path generation unit 16 to generate the path data.

Note that, even if the model is relearned, the path need not be modified. Specifically, if it is determined that the risk is not high even if the vehicle travels along the original path as a result of estimation of travel motion based on the relearned model, the replanning instruction unit 17 does not instruct the path generation unit 16 to generate the path data.

Figure 6:
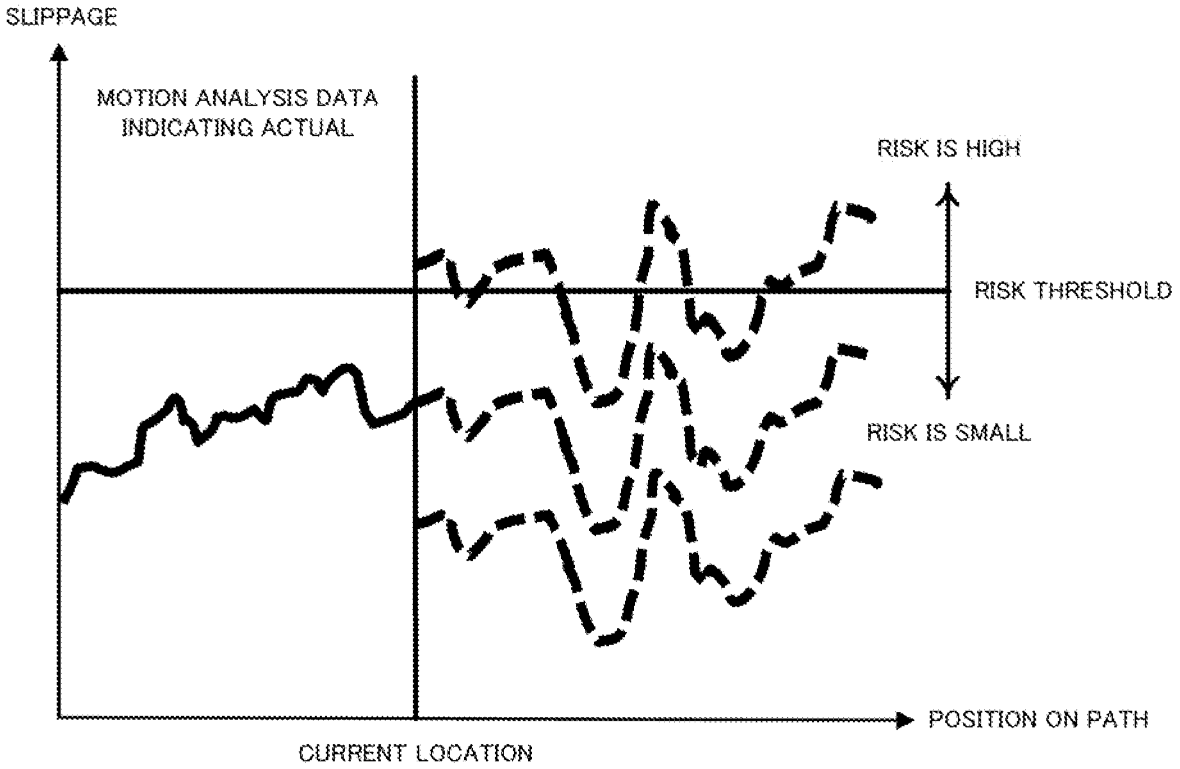
FIG. 6 is a diagram illustrating generation of the path data.

FIG. 6 is a diagram illustrating generation of the path data. As shown in FIG. 6, in the current position, the replanning instruction unit 17 estimates slippage in the path ahead, and if it is determined that the estimated slippage value is higher than a risk threshold (if the risk is high), since the path is to be modified, the replanning instruction unit 17 instructs the path generation unit 16 to generate the path data.

In contrast, in the current position, if the estimation value of the slippage in the path ahead is determined to be the threshold or less (if the risk is small), since the path is not to be modified, the replanning instruction unit 17 does not instruct the path generation unit 16 to generate the path data.

The mobile object control unit 50 controls and moves the mobile object based on the motion estimation result data and the path data.

Specifically, first, the mobile object control unit 50 obtains the motion estimation result data and the path data. Next, the mobile object control unit 50 generates information for controlling the units related to movement of the mobile object, based on the motion estimation result data and the path data. After that, the mobile object control unit 50 controls the mobile object to move from the current position to the destination.

Example 1

The motion estimation apparatus 10 and the path generation apparatus 20 will be specifically described. Example 1 describes a case where slippage (motion) of the work vehicle 1 while traveling on a slope in an unknown environment is estimated from data obtained while traveling a gentle slope. In Example 1, since the slippage is estimated, the slippage is modeled as a function relating to the topographic shape (inclination angle, unevenness) of the target environment.

Learning Operation of Example 1

In learning of Example 1, the motion analyzing unit 11 causes the work vehicle 1 to travel on a gently sloping topography with a lower risk in the target environment at a constant speed, and obtains the mobile object state data from the sensors 31 of the measurement unit 30 at a certain interval. The motion analyzing unit 11 obtains the mobile object state data at an interval of 0.1 second, 0.1 m, or the like.

Next, the motion analyzing unit 11 uses the obtained mobile object state data to calculate moving speeds $V_X$, $V_Y$, and $V_Z$ of the work vehicle 1 in the X, Y, and Z directions, a wheel rotation speed co of the work vehicle 1, and an attitude angle (roll angle θx, pitch angle θy, yaw angle θz) of the work vehicle 1 around the X, Y, and Z axes.

The moving speeds are calculated by dividing the difference in GPS latitude, longitude, and altitude between two points, by the difference in time between the two points, for example. The attitude angle is calculated by integrating the angular velocity of the IMU, for example.

Note that the traveling speeds and the attitude angle may also be calculated based on the Kalman filter, using both the mobile object state data measured by the GPS and the mobile object state data measured by the IMU. Alternately, the traveling speeds and the attitude angle may be calculated based on the SLAM (Simultaneous Localization and Mapping: a technique for concurrently performing estimation of the position of the mobile object and construction of the surrounding area map) based on data of the GPS, the IMU, and the LiDAR.

Next, as represented by Expression 5, the motion analyzing unit 11 calculates the slippage based on the traveling speed and wheel rotation speed of the work vehicle 1. Note that the slippage is a continuous value.

[Expression 5]

$$\text{slip} = (r\overline{\omega} - v_x)/r\overline{\omega} \tag{5}$$

slip: Slippage r: Wheel radius $\overline{\omega}$: Average rotational speed of each wheel $r\overline{\omega}$: vehicle translation speed without slippage (target speed)

$v_x$: moving speed in movement direction (X direction)

When the work vehicle 1 is travelling at the same speed as the target speed, slippage=0. Also, when the work vehicle 1 is not travelling at all, slippage=1. Also, when the work vehicle 1 is travelling at a higher speed than the target speed, the slippage is a negative value.

Next, the motion analyzing unit 11 outputs, to the learning unit 12, a plurality of data points (first motion analyzing data) with a roll angle θx, a pitch angle θy, and slippage assumed to be a set of data points.

Next, the learning unit 12 learns a model relating to the roll angle θx, the pitch angle θy, and the slippage, in the target environment, based on the similarly between the data points (first motion analysis data) that are output from the motion analyzing unit 11 and the data points (second motion analysis data) generated in the known environment in the past and stored in the storage device 40.

Alternatively, the learning unit 12 learns a model relating to the roll angle θx, the pitch angle θy, and slippage, in the target environment, based on the similarly between the model generated based on the data points (first motion analysis data) that are output from the motion analyzing unit 11 and the model generated based on the data points (second motion analysis data) generated in the known environment in the past stored in the storage device 40.

As a specific example, an example will be described in which, when the three pieces of known environment data have been obtained as shown in FIG. 2, the Gaussian process regression is applied to $f^{(Si)}$ in Expression 2, and parameters and hyperparameters of $f^{(Si)}$ are learned using the motion analysis data of $S_i$ and the motion analysis data of the target environment.

A likelihood of the motion analysis data in the target environment that is modeled using $f^{(Si)}$ is used for $w_i$ of Expression 2. When the models of the known environments are respectively assumed to represent a slippage event in the target environment, likelihood is a probability indicating the degree of likelihood of a data point in the target environment with respect to that model.

$g(w_i)$ in Expression 2 is assumed to be $w_i/\Sigma w_i$. At this time, if it is assumed that the likelihoods $p_i$ of the motion analysis data in the target environment of i=1, 2, and 3 are respectively $p_1$=0.5, $p_2$=0.2, and $p_3$=0.1, the weights $w_i$ respectively satisfy $w_1$=0.5, $w_2$=0.2, and $w_3$=0.1. The total of the weights $w_i$ satisfies $\Sigma w_i$=0.5+0.2+0.1=0.8.

Accordingly, $g(w_i)$=0.5/0.8=0.625, $g(w_2)$=0.2/0.8=0.25, $g(w_3)$=0.1/0.8=0.125. In this manner, the model of $f^{(T)}$ in Expression 2 is constructed as the total of weights $f^{(Si)}$ using $g(w_i)$ as the weight.

Also, for example, when the slippage is modeled for each of the known environments using the polynomial regression, the weight $w_i$ is determined based on an indicator that indicates the degree to which data in the target environment can be expressed using the model in each of the known environments.

Regarding the weight $w_i$, for example, the inverse number of an error of mean square (MSE) when the slippage in the target environment is estimated using the model in each known environment is set to the weight $w_i$. Alternatively, a determination coefficient ($R^2$) at the time when the slippage in the target environment is estimated using the model in each known environment is set to the weight $w_i$.

Further, for example, in the case where the slippage is modeled using the Gaussian process regression for each known environment, if the Gaussian process regression is used, it is possible to perform not only average estimation but also express the uncertainty of the estimation by probabilistic distribution. In this case, the likelihood of the data in the target environment, when the slippage in the target environment is estimated using the model of each known environment, assuming that the weight is $w_i$, is used.

Note that, regardless of which indicator out of the error of mean square (MSE), the determination coefficient ($R^2$), and the likelihood is used as the similarity, if knowledges with a low similarity are combined, it is highly possible that the estimation accuracy in the target environment will degrade. For this reason, it is also possible to set thresholds in advance for the similarities (1/MSE, $R^2$, and likelihood), and to use only the model of the known environment for which the similarity is the threshold or more. Further, it is also possible to use only the model with the maximum similarity or the models of a predetermined number in descending order of similarity.

Note that modeling may be performed using methods other than the above-described polynomial regression and Gaussian process regression. Examples of other machine learning methods include a support vector machine and a neural network. Also, modeling may be performed in a white-box manner based on a physical model rather than modeling the relationship between input and output in a black-box manner as in the machine learning method.

Regardless of which of the above-described model methods is used, the model parameters stored in the storage device 40 may also be used as is, or the model parameters may also be relearned (updated) using data obtained while traveling in the target environment.

Also, if knowledges with a low similarity are combined, it is highly possible that the estimation accuracy in the target environment will be degraded. For this reason, it is also possible that thresholds are set in advance for the similarities (1/MSE, $R^2$, and likelihood), and only the model of the known environment for which the similarity is the threshold or more is used.

Note that the models in the plurality of known environments that are stored in the storage device 40 may be obtained by learning based on data obtained in the real world, or based on data obtained through physical simulation.

Estimation Operation in Example 1

In estimation, the work vehicle 1 measures the topographic shape of the land to travel, and estimates the slippage in the target environment based on the learned model.

Specifically, first, the environment analyzing unit 13 obtains the environment state data from the sensors 32 of the measurement unit 30. The environment analyzing unit 13 obtains the three-dimensional point cloud (environment state data) generated by measuring the forward target environment using a LiDAR mounted in the work vehicle 1, for example.

Next, the environment analyzing unit 13 generates topographic shape data (environment analysis data) relating to the topographic shape by processing the three-dimensional point cloud. Generation of information relating to the topographic shape will be specifically described.

Figure 7:
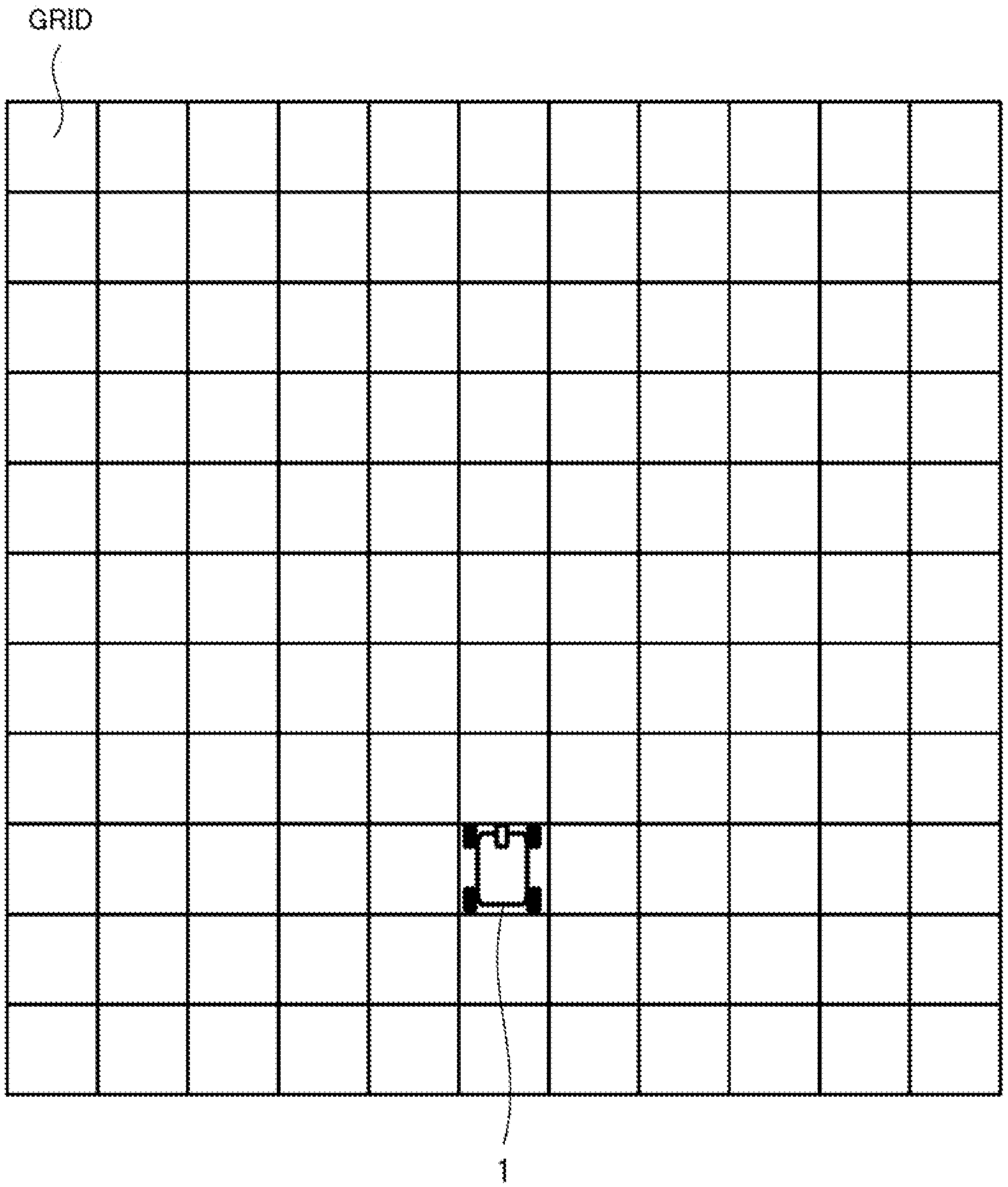
FIG. 7 is a diagram illustrating one example of information regarding the topographic shape.

First, as shown in FIG. 7, the environment analyzing unit 13 divides the target environment (space) into a grid, and assigns a point cloud to each grid cell. FIG. 7 is a diagram illustrating one example of information regarding the topographic shape.

Next, the environment analyzing unit 13 calculates, for each grid cell, the approximate plane with which the mean distance error of the point cloud is the minimum, from the point clouds included in the grid cell itself and the grid cells in the surrounding eight directions, and calculates the maximum inclination angle and the inclination direction of the approximate plane.

Next, the environment analyzing unit 13 generates, for each grid cell, topographic shape data (environment analysis data) by associating the coordinates representing the position of the grid cell, the maximum inclination angle and the inclination direction of the approximate plane with each other and stores the data in the storage device 40.

Next, the estimation unit 14 estimates the slippage for each grid cell based on the topographic shape data generated by the environment analyzing unit 13 and the learned models of the slippage.

A method for estimating the slippage in each grid cell will be specifically described below.

(1) The slippage is estimated by inputting only the maximum inclination angle of the grid cell to the model. Note that, in actuality, the slippage of the work vehicle 1 is determined based on the orientation of the work vehicle 1 with respect to the slope. For example, in the case where the work vehicle 1 faces in the maximum inclination angle direction (the orientation in which the inclination is steepest), the slippage is largest, and thus estimation of the slippage using the maximum inclination angle means performing estimation in a conservative manner. Note that the slippage may be estimated on the following condition: the pitch angle of the work vehicle 1=the maximum inclination, and the roll angle=0.

(2) The estimation unit 14 estimates the slippage corresponding to the direction in which the work vehicle 1 passes through the grid cell, based on the information about the maximum inclination angle and the slope direction stored in each grid cell. In this case, the roll angle and the pitch angle of the work vehicle 1 is calculated based on the maximum angle, the slope direction, and the traveling direction, of the work vehicle 1. Also, for each grid cell, the slippage is estimated with respect to a plurality of traveling directions (e.g., every 15 degrees) of the work vehicle 1.

(3) In the case where it is possible to express the estimation considering the uncertainty by Gaussian process regression, etc., the mean values and the distributed values of the slippage are estimated. The motion of the work vehicle 1 becomes complicated on a steep slope and a severely uneven topography. Accordingly, there is a high possibility that variation in the slippage will increase. And thus, estimating the distribution as well as the mean of the slippage makes it further possible to operate the work vehicle 1 safely.

Figure 8:
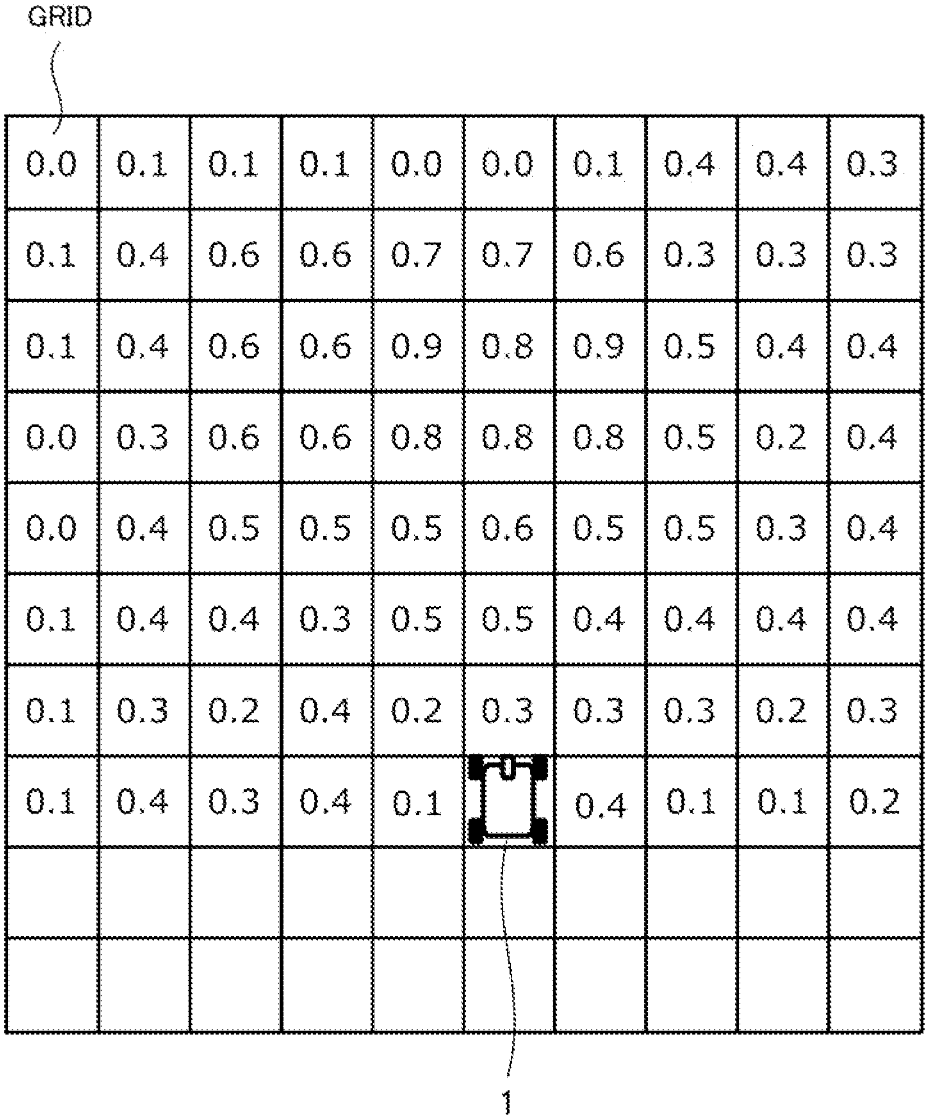
FIG. 8 is a diagram illustrating the relationship between the grid cells and the slippage.

Next, as shown in FIG. 8, the estimation unit 14 generates the motion estimation result data by associating each grid cell with the estimated slippage (continuous value of the slippage in the maximum inclination angle direction) and stores the data in the storage device 40. FIG. 8 is a diagram illustrating the relationship between the grid cells and the slippage.

Alternatively, the estimation unit 14 generates the motion estimation result data by associating each grid cell with the estimated slippage and the vehicle traveling direction, and stores the data in the storage device 40. The vehicle traveling direction is indicated using the angle with respect to a predetermined direction, for example.

Figure 9:
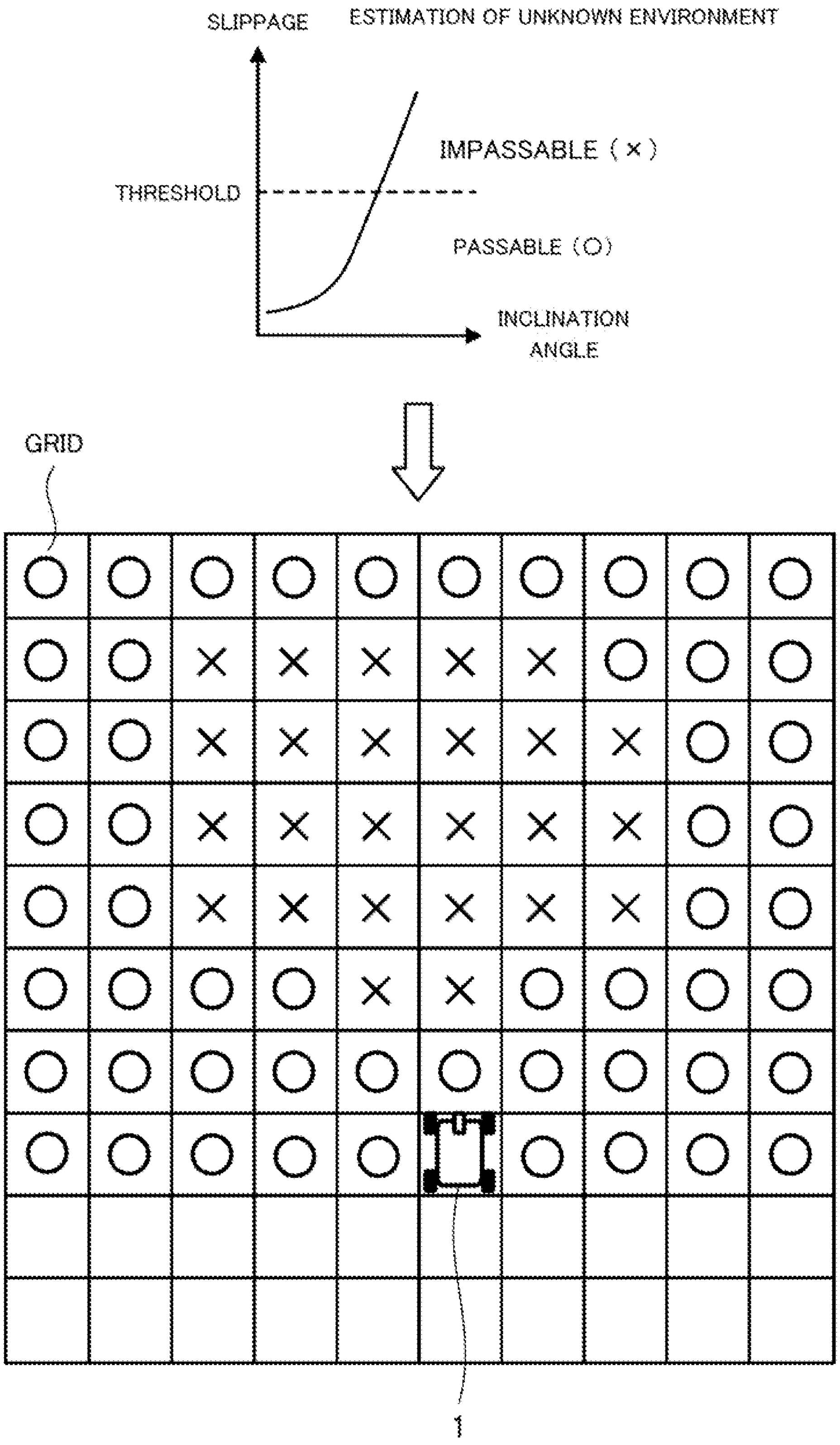
FIG. 9 is a diagram illustrating the relationship between the grid cells and whether each grid cell is passable or impassable.

Alternatively, the estimation unit 14 generates, the motion estimation result data by associating the respective grid cells with the mean of the estimated slippage, the distribution of the slippage, and the vehicle traveling direction, and stores the data in the storage device 40. Alternatively, the estimation unit 14 determines whether the grid cell is passable or impassable, based on a predetermined threshold with respect to the slippage, generates the motion estimation result data by associating the information indicating the determination result with the grid cells, and stores the data in the storage device 40. FIG. 9 is a diagram illustrating the relationship between the grid cells and whether each grid cell is passable or impassable. “o” shown in FIG. 9 represents “passable”, while “x” represents “impassable”.

Note that, as described above, in Example 1, the slippage is modeled using only the topographic shape as the feature amount, however, in the case where the work vehicle 1 is equipped with an image capturing device such as a camera, image data (e.g., brightness value and texture of the pixels) may be added to the topographic shape as the input data (feature amount) of the model.

Also, since it is highly possible that the motion of the work vehicle 1 in a position near the current position will be close to the motion in the current position, the position where the mobile object state data is obtained may be used as the feature amount. Further, the moving speed, the steering operation amount, changes in the weights and weight balance due to an increase/decrease in the load of the work vehicle 1, passive/active changes in the shape of the work vehicle 1 due to the suspension or the like, may be added to the feature amount.

Although Example 1 described slippage, vibration of the work vehicle 1 is another example of motion that is to be estimated. The basic process flow is similar to the above-described case of slippage. In the case of vibration, however, time-series information of the acceleration measured by the IMU is transformed into the magnitude and frequency of the vibration by the Fourier transformation, and the transformed values are modeled as the function related to the topographic shape.

Further, other examples of the motion to be estimated include power consumption, fuel consumption, and vehicle attitude angle. The basic flow of leaning and estimation of those motions are similar to the above-described case of slippage.

Power consumption and fuel consumption are modeled using the measurement value of corresponding measuring instruments and data regarding the topographic shape.

In many cases, the attitude angle is substantially the same as the inclination angle of the ground. However, depending on the geological characteristics and the degree of unevenness of the ground, the vehicle body may tilt at an angle larger than the ground inclination angle and enter a dangerous state. In view of this, for example, the attitude angle is modeled as a function expressing the topographic shape of the target environment, using the topographic shape estimated from the point clouds measured in advance by the LiDAR, and the attitude angle of the vehicle (attitude angle of the vehicle calculated using the angular velocity measured by the IMU) when actually traveling on the topography, as a pair of input/output data.

Example 2

In Example 2, a method for planning a path and controlling movement of the mobile object in an unknown environment will be described. Specifically, in Example 2, the path is obtained based on the estimation result obtained in Example 1, and the mobile object is moved according to the obtained path.

An example will be described in which a path of the work vehicle 1 from the current position to the target location is planned based on the estimation of slippage by the estimation unit 14.

The larger the value of slippage is, not only the lower the movement efficiency of the work vehicle 1, but also the possibility is higher that the work vehicle 1 will become incapacitated and unable to move. In view of this, the path is generated such that the locations corresponding to grid cells that are estimated to have high values of slippage are avoided.

A case of planning a path will be described using an example in which whether the location is passable or impassable is determined from the slippage estimated based on the maximum inclination angle shown in FIG. 9.

Here, any algorithm may be used to plan the path. For example, the generally-used A* (A-star) algorithm is used. In the A* algorithm, the nodes adjacent to the current location are sequentially searched, and the path is efficiently searched based on the movement cost between the current search node and the adjacent search node and the movement cost from the adjacent node to the target location.

Also, the central position for each grid cell (coordinates) is assumed to be one node, and movement is possible from each node to the adjacent nodes that are in sixteen directions. The movement cost is assumed to be the Euclidean distance between the nodes.

Figure 10:
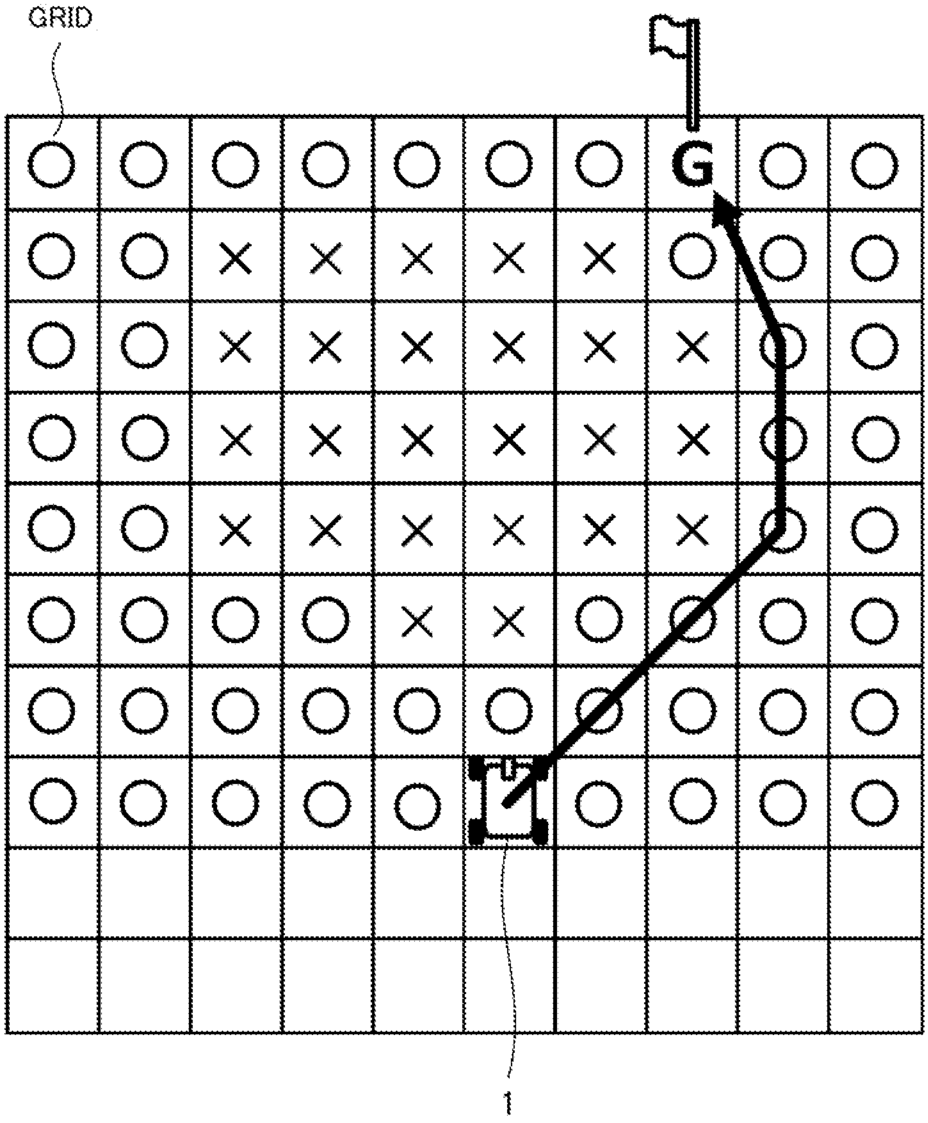
FIG. 10 is a diagram illustrating an example of a path.

In the case where the node is determined to be passable, the path is searched on the assumption that the movement from another node to that node is possible. As a result, the path from the current location to the target location G (solid arrow in FIG. 10) as shown in FIG. 10 is generated. FIG. 10 is a diagram illustrating an example of a path.

Note that the path generation unit 16 outputs information indicating a series of nodes on the path to the mobile object control unit 50.

Also, in actuality, the path generation unit 16 generates the path including the orientation of the work vehicle 1 in addition to the position of the work vehicle 1. This is because the movement direction of the work vehicle 1 is restricted, for example, due to the work vehicle 1 not being able to move laterally, and there being a restriction on the steering angle. Thus, the orientation of the vehicle needs to be considered as well.

Next, a case of planning a path will be described using an example in which the continuous slippage shown in FIG. 8 is assigned to the grid cells will be described.

Figure 11:
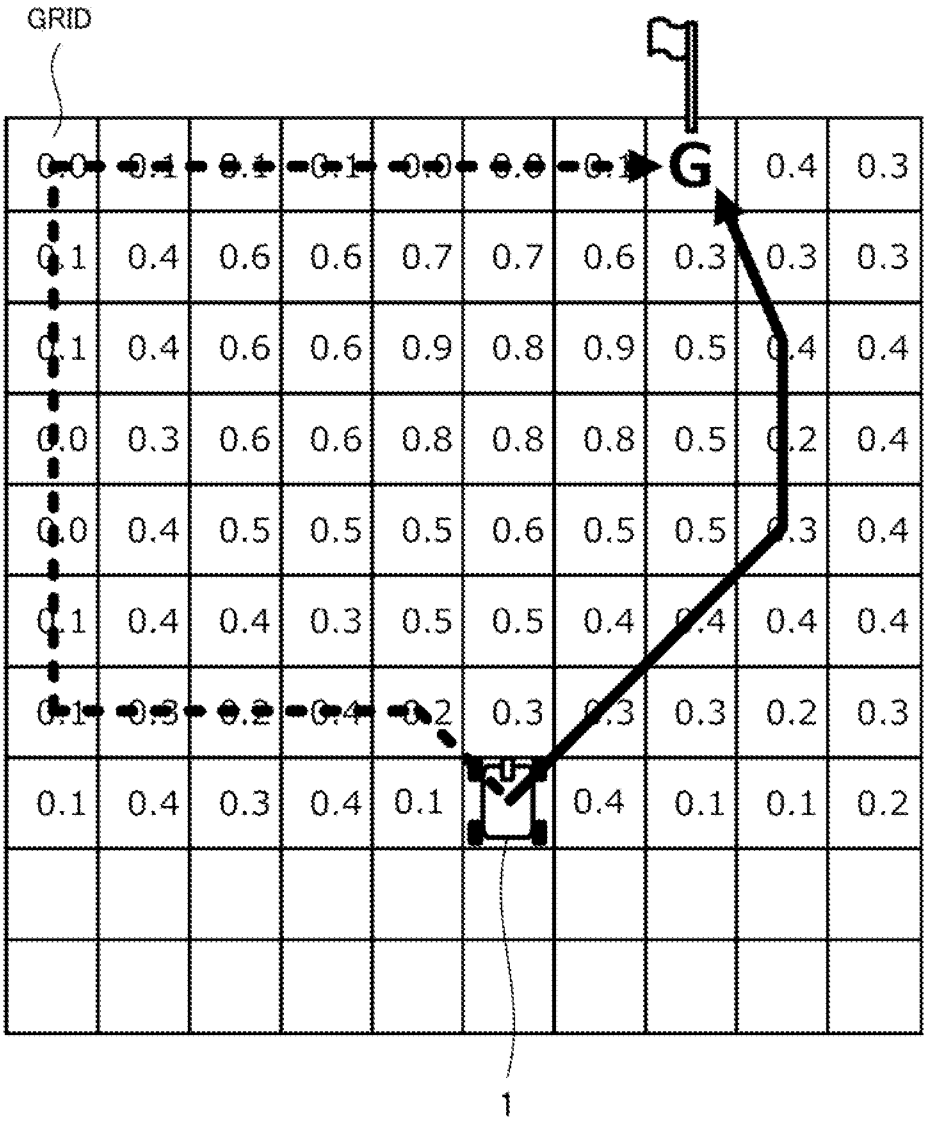
FIG. 11 is a diagram illustrating an example of a path.

Here, the central position (coordinates) of each grid cell is assumed to be one node, and movement is possible from each node to the adjacent nodes that are in sixteen directions. Since the movement cost reflects the estimated slippage in the path search, the movement cost between the nodes is assumed to be the total weight of the distance and slippage shown in Expression 6, rather than merely the Euclidean distance, for example. FIG. 11 is a diagram illustrating an example of a path.

[Expression 6]

$$\text{Cost} = a * L + b * \text{Slip}$$

Cost: movement cost between the nodes

L: Euclidean distance

Slip: Slippage a, b: Weight used to generate path (value greater than or equal to 0)

In the example in FIG. 11, if the weight a is set larger than a weight b, the path (solid arrow in FIG. 11) having a relatively short Euclidean distance L is generated. In contrast to this, if the weight b is set larger than the weight a, a path (broken arrow in FIG. 11) that has a long Euclidean distance but avoids the nodes with a high slippage value is generated.

Note that, in the case where it is possible to express the estimation considering the uncertainty as well by Gaussian process regression or the like, in other words, in the case where the mean value and the variance value of the slippage are estimated for each grid cell, a path is generated such that grid cells having a large distribution value (uncertainty of estimation) are avoided even if the mean value is small.

[Apparatus Operations]

Next, the operations of the motion estimation apparatus 10, the path generation apparatus according to the example embodiment, Example 1, and Example 2 of the invention will be described using the drawings.

Figure 12:
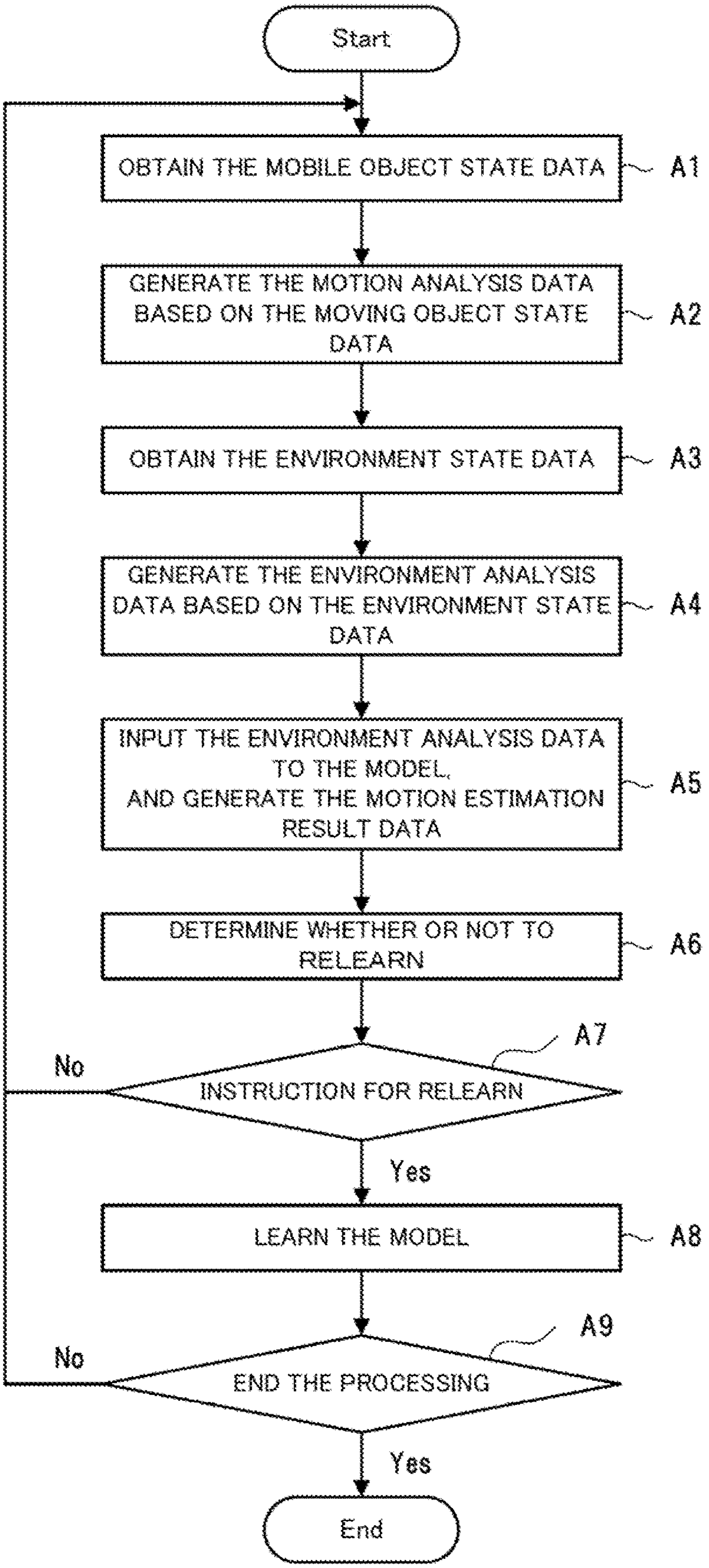
FIG. 12 is a diagram illustrating an example of the operations of the motion estimation apparatus.
Figure 13:
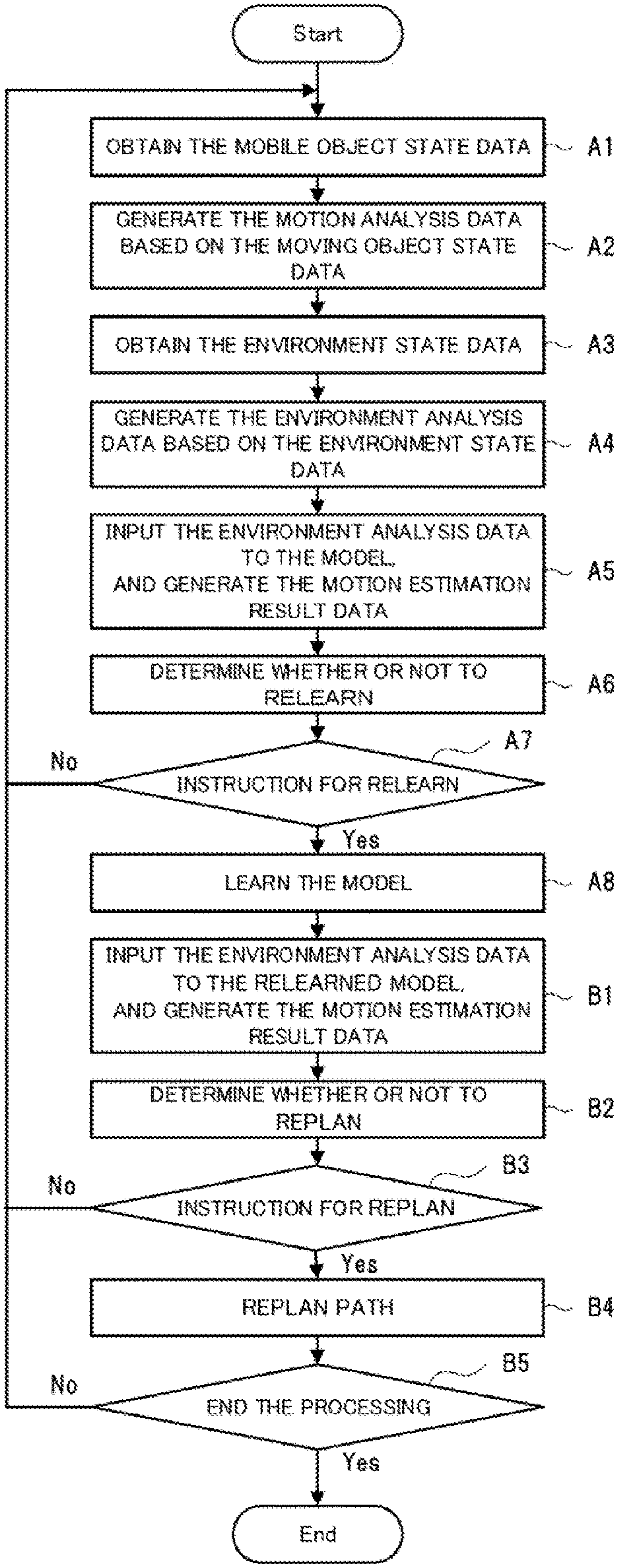
FIG. 13 is a diagram illustrating an example of the operations of the path generation apparatus.

FIG. 12 is a diagram illustrating an example of the operations of the motion estimation apparatus. FIG. 13 is a diagram illustrating an example of the operations of the path generation apparatus.

In the following description, the drawings will be referred to as appropriate. Furthermore, in the example embodiment, the motion estimation method and the path generation method are implemented by causing the motion estimation apparatus 10, the path generation apparatus 20, and the system 100 in the example embodiment, Example 1 and Example 2 to operate. Accordingly, the descriptions of the motion estimation method, the path generation method, according to the example embodiment, Example 1 and Example 2 are substituted for the following descriptions of the operations of the motion estimation apparatus 10, the path generation apparatus 20, and the system 100.

[Operations of Motion Estimation Apparatus]

As shown in FIG. 12, first, the motion analyzing unit 11 obtains the mobile object state data from the sensors 31 (step A1). Next, the motion analyzing unit 11 analyzes the motion of the mobile object based on the mobile object state data indicating the state of the mobile object, and generates first motion analysis data indicating the motion of the mobile object (step A2).

Next, the environment analyzing unit 13 obtains the environment state data from the sensor 32 (step A3). Next, the environment analyzing unit 13 analyzes the target environment based on the environment state data representing the state of the target environment, and generates the environment analysis data (step A4).

Note that, after processing steps A1 and A3 or steps A3 and A1, processing in steps A2 and A4, or A4 and A2 may be performed in the stated order. Also, after performing processing in steps A3 and A4, processing in steps A1 and A2 may be performed. Further, processing in steps A1 and A2 and processing in steps A3 and A4 may also be processed in parallel.

Next, the estimation unit 14 inputs the environment analysis data to a model for estimating motion of the mobile object in the target environment and estimates the motion of the mobile object in the target environment (step A5).

Next, the learning instruction unit 15 sets the confidence interval based on the motion estimation result data estimated using the model, and determines whether the motion analysis data is in the set confidence interval (step A6). If the motion analysis data is in the confidence interval (if relearning is not performed), the learning instruction unit 15 does not instruct the learning unit 12 to relearn the model (step A7: No). If the motion analysis data is in the confidence interval (if relearning is performed), the learning instruction unit 15 instructs the learning unit 12 to relearn the model (step A7: Yes).

Next, the learning unit 12 learns the model for estimating the motion of the mobile object in the target environment, using the first motion analysis data generated in the target environment and the second motion analysis data generated for each known environment of the respective known environments in the past (step A8).

Next, if the motion estimation apparatus 10 receives the instruction to end the motion estimation processing (step A9: Yes), the motion estimation apparatus ends the motion estimation processing. If the motion estimation processing is continued (step A9: No), the learning unit 12 transitions to step A1 and continues the motion estimation processing.

[Operations of Motion Estimation Apparatus]

As shown in FIG. 13, first, the estimation unit 14 performs the motion estimation processing of steps A1 to A8. Next, the estimation unit 14 inputs the environment analysis data to the relearned model, and estimates again the motion of the mobile object in the target environment (step B1).

Next, the replanning instruction unit 17 obtains the motion estimation result data generated using the relearned model from the estimation unit 14, and determines whether to generate the path (replan) based on the obtained motion estimation result data (step B2).

Next, if the replanning instruction unit 17 determines to perform replanning, the replanning instruction unit 17 instructs the path generation unit 16 to generate the path data (step B3: Yes). Also, if the replanning instruction unit 17 determines to not perform replanning, the replanning instruction unit 17 does not instruct the path generation unit 16 to generate the path data (step B3: No).

Specifically, if the model is relearned, the replanning instruction unit 17 instructs the path generation unit 16 to generate the path data. Also, when the path needs to be modified even if the model is not relearned, the replanning instruction unit 17 instructs the path generation unit 16 to generate the path data. For example, when an obstacle is detected on the planned path, when the mobile object significantly deviates from the planned path, or the like, the replanning instruction unit 17 instructs the path generation unit 16 to generate the path data.

Next, the path generation unit 16 generates the path data representing the path from the current position to the destination, based on the motion estimation result data (step B4).

Specifically, in step B4, the path generation unit 16 obtains the motion estimation result data of the mobile object in the target environment as shown in FIGS. 8 and 9 from the estimation unit 14. Next, in step B4, the path generation unit 16 generates the path data by applying a general path planning processing to the motion estimation result data of the mobile object. Next, the path generation unit 16 outputs the path data to the mobile object control unit 50.

The mobile object control unit 50 controls and moves the mobile object based on the motion estimation result data and the path data.

Specifically, first, the mobile object control unit 50 obtains the motion estimation result data and the path data. Next, the mobile object control unit 50 generates information related to movement of the mobile object, based on the motion estimation result data and the path data. After that, the mobile object control unit 50 controls and moves the mobile object from the current position to the target site.

Next, if the path generation apparatus 20 receives the instruction for ending the path generation processing (step B5: Yes), the path generation apparatus 20 ends the path generation processing. If the path generation processing is continued (step B5: No), the path generation apparatus 20 transitions to step A1 and continues the path generation processing.

Effect of Example Embodiments

As described above, according to the example embodiment, Example 1, and Example 2, the number of times of relearning of the model in unknown environment can be reduced. As a result of that, the motion of the mobile object such as a work vehicle may be accurately estimated, and decrease in the operation efficiency can be suppressed.

[Program]

The program according to the example embodiment, Example 1, and Example 2 may be a program that causes a computer to execute steps A1 to A9 and steps B1 to B5 shown in FIG. 12 and FIG. 13. By installing this program in a computer and executing the program, the motion estimation apparatus 10, the path generation apparatus 20, the systems 100, and their methods in the example embodiment, example 1, and example 2 can be realized. In this case, the processor of the computer performs processing to function as the motion analyzing unit 11, the learning unit 12, the environment analyzing unit 13, the estimation unit 14, the learning instruction unit 15, the path generation unit 16, replanning instruction unit 17, and the mobile object control unit 50. Also, the program according to the example embodiment, Example 1, and Example 2 may be executed by a computer system constructed by a plurality of computers. In this case, for example, each computer may function as any of the motion analyzing unit 11, the learning unit 12, the environment analyzing unit 13, the estimation unit 14, the learning instruction unit 15, the path generation unit 16, replanning instruction unit 17, and the mobile object control unit 50.

[Physical Configuration]

Figure 14:
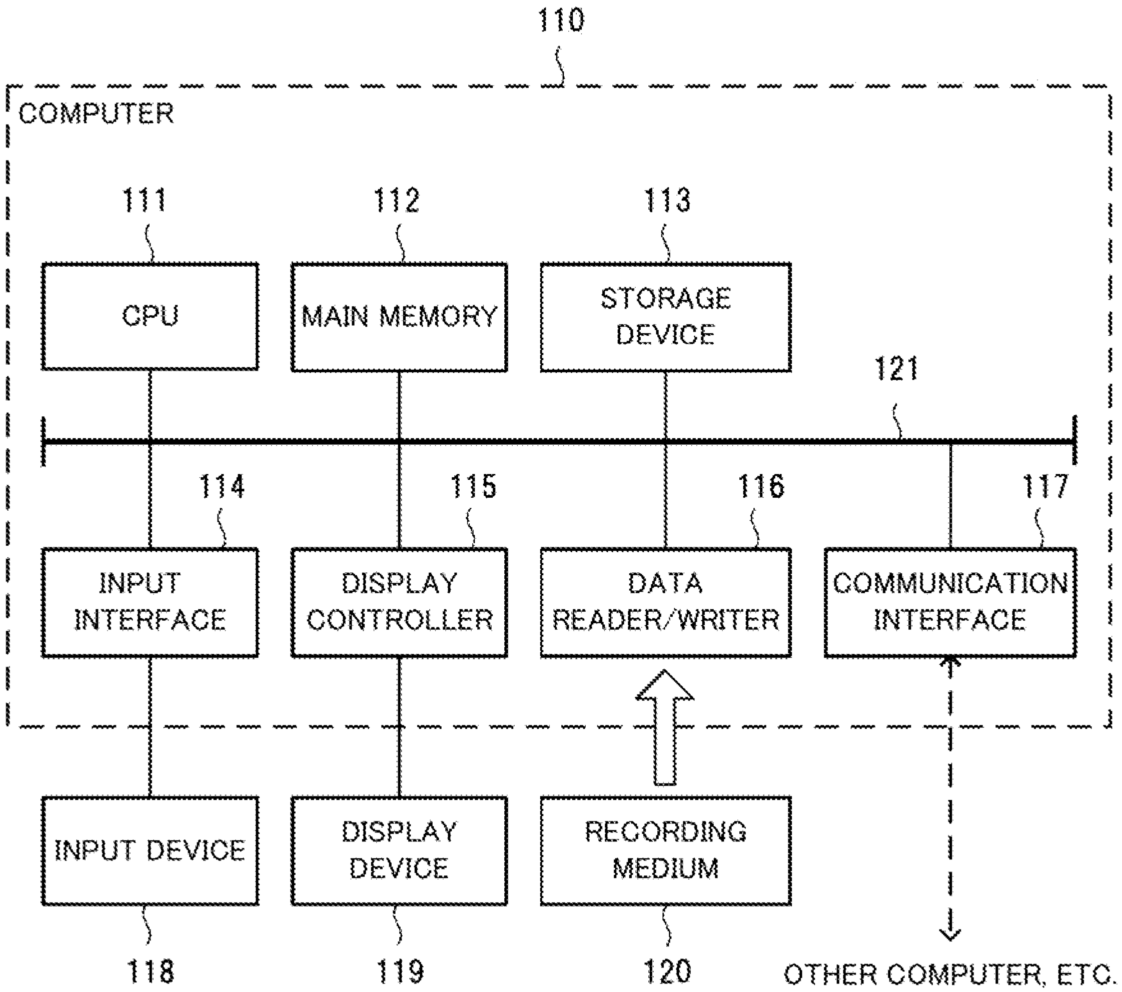
FIG. 14 is a block diagram showing an example of a computer that realizes a system having the motion estimation apparatus or the path generation apparatus.

Here, a computer that realizes the program, the motion estimation apparatus 10, the path generation apparatus 20, and the systems 100 by executing the program according to the example embodiment, Example 1, and Example 2 will be described with reference to FIG. 14. FIG. 14 is a block diagram showing an example of a computer that realizes a system having the motion estimation apparatus or the path generation apparatus.

As shown in FIG. 14, a computer 110 includes a CPU (Central Processing Unit) 111, a main memory 112, a storage device 113, an input interface 114, a display controller 115, a data reader/writer 116, and a communications interface 117. These units are each connected so as to be capable of performing data communications with each other through a bus 121. Note that the computer 110 may include a GPU (Graphics Processing Unit) or an FPGA (Field-Programmable Gate Array) in addition to the CPU 111 or in place of the CPU 111.

The CPU 111 opens the program (code) according to this example embodiment, which has been stored in the storage device 113, in the main memory 112 and performs various operations by executing the program in a predetermined order. The main memory 112 is typically a volatile storage device such as a DRAM (Dynamic Random Access Memory). Also, the program according to this example embodiment is provided in a state being stored in a computer-readable recording medium 120. Note that the program according to this example embodiment may be distributed on the Internet, which is connected through the communications interface 117.

Also, other than a hard disk drive, a semiconductor storage device such as a flash memory can be given as a specific example of the storage device 113. The input interface 114 mediates data transmission between the CPU 111 and an input device 118, which may be a keyboard or mouse. The display controller 115 is connected to a display device 119, and controls display on the display device 119.

The data reader/writer 116 mediates data transmission between the CPU 111 and the recording medium 120, and executes reading of a program from the recording medium 120 and writing of processing results in the computer 110 to the recording medium 120. The communications interface 117 mediates data transmission between the CPU 111 and other computers.

Also, general-purpose semiconductor storage devices such as CF (Compact Flash (registered trademark)) and SD (Secure Digital), a magnetic recording medium such as a Flexible Disk, or an optical recording medium such as a CD-ROM (Compact Disk Read-Only Memory) can be given as specific examples of the recording medium 120.

Also, instead of a computer in which a program is installed, the motion estimation apparatus 10, the path generation apparatus 20, and the systems 100 according to the example embodiment, Example 1, and Example 2 can also be realized by using hardware corresponding to each unit. Furthermore, a portion of the motion estimation apparatus 10, the path generation apparatus 20, and the systems 100 may be realized by a program, and the remaining portion realized by hardware.

[Supplementary Notes]

Furthermore, the following supplementary notes are disclosed regarding the example embodiments described above. Some portion or all of the example embodiments described above can be realized according to (supplementary note 1) to (supplementary note 12) described below, but the below description does not limit.

(Supplementary Note 1)

A motion estimation apparatus comprising:

a motion analyzing unit that generates first motion analysis data representing actual motion of a mobile object in a first environment;

an environment analyzing unit that analyzes the first environment based on environment state data representing a state of the first environment, and generating environment analysis data;

an estimation unit that inputs the environment analysis data to a model for estimating motion of a mobile object in the first environment, and estimates the motion of the mobile object in the first environment; and a learning instruction unit that sets a confidence interval, based on the motion estimation result data estimated by the model, and if the first motion analysis data is not in the set confidence interval, instructing a learning unit that learns the model to relearn the model.

(Supplementary Note 2)

The motion estimation apparatus according to claim 1, wherein the learning unit learns the model using the first motion analysis data, second motion analysis data generated for each of second environments, and a similarity of geological features for each position in the first environment and the second environments.

(Supplementary Note 3)

A path generation apparatus comprising:

a motion analyzing unit that generates first motion analysis data representing actual motion of a mobile object in a first environment;

an environment analyzing unit that analyzes the first environment, based on environment state data representing a state of the first environment, and generates environment analysis data;

an estimation unit that inputs the environment analysis data to a model for estimating motion of a mobile object in the first environment and estimates the motion of the mobile object in the first environment;

a learning instruction unit that sets a confidence interval, based on the motion estimation result data estimated by the model, and if the first motion analysis data is not in the set confidence interval, instructing a learning unit that learns the model to relearn the model, and a path generating unit that, if the model is relearned, regenerating path data representing a path from a current position to a destination, based on motion estimation result data generated using the relearned model.

(Supplementary Note 4)

The path generation apparatus according to claim 3, wherein the learning unit learns the model using the first motion analysis data, second motion analysis data generated for each of second environments, and a similarity in geological features for each position in the first environment and the second environments.

(Supplementary Note 5)

A motion estimation method, comprising:

a motion analyzing step of generating first motion analysis data representing actual motion of a mobile object in a first environment;

an environment analyzing step of analyzing the first environment based on environment state data representing a state of the first environment, and generating environment analysis data;

an estimation step, inputting the environment analysis data to a model for estimating motion of a mobile object in the first environment, and estimating the motion of the mobile object in the first environment; and a learning instruction step of setting a confidence interval, based on the motion estimation result data estimated by the model, and if the first motion analysis data is not in the set confidence interval, instructing a learning unit that learns the model to relearn the model.

(Supplementary Note 6)

The motion estimation method according to claim 5, wherein the model is learned using the first motion analysis data, second motion analysis data generated for each of second environments, and a similarity in geological features for each position in the first environment and the second environments.

(Supplementary Note 7)

A path generation method, comprising:

a motion analyzing step of generating first motion analysis data representing actual motion of a mobile object in a first environment;

an environment analyzing step of analyzing the first environment, based on environment state data representing a state of the first environment, and generating environment analysis data;

an estimation step of inputting the environment analysis data to a model for estimating motion of a mobile object in the first environment and estimating the motion of the mobile object in the first environment;

a learning instruction step of setting a confidence interval based on the motion estimation result data estimated from the model, and if the first motion analysis data is not in the set confidence interval, causing a learning unit learns the model to relearn the model; and a path generating step of, if the model is relearned, regenerating path data representing a path from a current position to a destination, based on motion estimation result data generated using the relearned model.

(Supplementary Note 8)

The path generation method according to claim 7, wherein the model is learned using the first motion analysis data, second motion analysis data generated for each of second environments, and a similarity of geological features for each position in the first environment and the second environments.

(Supplementary Note 9)

A computer-readable recording medium that includes a program recorded thereon, the program including instructions that cause a computer to carry out:

generating first motion analysis data representing actual motion of a mobile object in a first environment;

a motion analyzing step of generating first motion analysis data representing actual motion of a mobile object in a first environment;

an environment analyzing step of analyzing the first environment based on environment state data representing a state of the first environment, and generating environment analysis data;

an estimation step, inputting the environment analysis data to a model for estimating motion of a mobile object in the first environment, and estimating the motion of the mobile object in the first environment; and a learning instruction step of setting a confidence interval, based on the motion estimation result data estimated by the model, and if the first motion analysis data is not in the set confidence interval, instructing a learning unit that learns the model to relearn the model.

The computer-readable recording medium according to claim 9, the model is learned using the first motion analysis data, second motion analysis data generated for each of second environments, and a similarity in geological features for each position in the first environment and the second environments.

(Supplementary Note 11)

A computer-readable recording medium that includes a program recorded thereon, the program including instructions that cause a computer to carry out:

generating first motion analysis data representing actual motion of a mobile object in a first environment;

a motion analyzing step of generating first motion analysis data representing actual motion of a mobile object in a first environment;

an environment analyzing step of analyzing the first environment, based on environment state data representing a state of the first environment, and generating environment analysis data;

an estimation of inputting the environment analysis data to a model for estimating motion of a mobile object in the first environment and estimating the motion of the mobile object in the first environment;

a learning instruction step of setting a confidence interval based on the motion estimation result data estimated from the model, and if the first motion analysis data is not in the set confidence interval, causing a learning unit learns the model to relearn the model; and a path generating step of, if the model is relearned, regenerating path data representing a path from a current position to a destination, based on motion estimation result data generated using the relearned model.

(Supplementary Note 12)

The computer-readable recording medium according to claim 11, the model is learned using the first motion analysis data, second motion analysis data generated for each of second environments, and a similarity in geological features for each position in the first environment and the second environments.

Although the invention of the application has been described above with reference to an example embodiment, the invention is not limited to the example embodiment described above. Various modifications apparent to those skilled in the art can be made to the configurations and details of the invention within the scope of the invention.

INDUSTRIAL APPLICABILITY

As described above, according to the invention, it is possible to improve the operation efficiency of a mobile object by reducing the number of times of relearning a model in an unknown environment. As a result, it is possible to accurately estimate the motion of a mobile object such as a work vehicle, and to suppress a decrease in operational efficiency of the work vehicle. The invention is useful in fields where it is necessary to estimate the of motion of moving object.

REFERENCE SIGNS LIST

1 Work vehicle
10 Motion estimation apparatus
11 Motion analyzing unit
12 Learning unit
13 Environment analyzing unit
14 Estimation unit
15 Learning instruction unit
16 Path generation unit
17 Replanning instruction unit
20 Path generation apparatus
30 Measurement unit
31, 32 Sensors
40 Storage device
50 Mobile object control unit
100 System
110 Computer
111 CPU
112 Main memory
113 Storage device
114 Input interface
115 Display controller
116 Data reader/writer
117 Communication interface
118 Input device
119 Display device
120 Recording medium
121 Bus

What is claimed is:

1. A motion estimation apparatus comprising:

first sensors configured to measure a state of a mobile object, the mobile object being an autonomous vehicle or an autonomous robot;

second sensors configured to measure a state of a first environment surrounding the mobile object;

one or more memories storing instructions and a model; and one or more processors configured to execute the instructions to:

analyze mobile object state data measured by the first sensors, and generate first motion analysis data representing actual motion of the mobile object in the first environment;

analyze environment state data measured by the second sensors, and generate environment analysis data representing a state of the first environment;

input the environment analysis data to the model for estimating motion of the mobile object in the first environment, and estimate the motion of the mobile object in the first environment to generate motion estimation result data;

determine whether the first motion analysis data is outside a confidence interval over a predetermined range, wherein the confidence interval is based on motion estimation result data estimated by the model; and in response to determining that the first motion analysis data is outside the confidence interval over the predetermined range, instruct a learning device for learning the model to relearn the model.

2. The motion estimation apparatus according to claim 1, wherein the one or more processors are further configured to execute the instructions to:

learn the model using the first motion analysis data, second motion analysis data generated for each of known second environments in the past, and a similarity of geological features for each position in the first environment and the second environments.

3. The motion estimation apparatus according to claim 1, wherein the one or more processors are further configured to execute the instructions to:

calculate similarity between the first environment and known second environments using the first motion analysis data and second motion analysis data generated for each of known the second environments in the past, learn the model using the calculated similarity and the models learned in the respective the second environments.

4. The motion estimation apparatus according to claim 1, wherein the model is composed of a first model that inputs topographic information to estimate motion and a second model that inputs positional information and geological features to estimate motion, and the one or more processors are further configured to execute the instructions to, calculate a product or a sum of an estimation result of the first model and an estimation result of the second model, and the calculated result is used as an estimation result of the model.

5. A path generation apparatus comprising:

one or more memories storing instructions and a model; and one or more processors configured to execute the instructions to:

generate first motion analysis data representing actual motion of a mobile object in a first environment, the mobile object being an autonomous vehicle or an autonomous robot;

analyze the first environment, based on environment state data representing a state of the first environment, and generating environment analysis data;

input the environment analysis data to the model for estimating motion of a mobile object in the first environment and estimating the motion of the mobile object in the first environment to generate motion estimation result data;

determine whether the first motion analysis data is outside a confidence interval over a predetermined range, wherein the confidence interval is based on motion estimation result data estimated by the model;

in response to determining that the first motion analysis data is outside the confidence interval over the predetermined range, instruct a learning device for learning the model to relearn the model, if the model is relearned, regenerate path data representing a path from a current position to a destination, based on motion estimation result data generated using the relearned model;

generate information for controlling movement of the mobile object, based on the motion estimation result data and the path data, and control the mobile object to move from the current position to the destination; and in the current position, if the motion estimation result data is higher than a risk threshold, generate the path data since the path is to be modified, or in the current position, if the motion estimation result data is equal to or lower than the risk threshold, the path is not to be modified.

6. The path generation apparatus according to claim 5, wherein the one or more processors are further configured to execute the instructions to:

learn the model using the first motion analysis data, second motion analysis data generated for each of second environments, and a similarity in geological features for each position in the first environment and the second environments.

7. A motion estimation method performed by a motion estimation apparatus, wherein the motion estimation apparatus storing a model and comprises:

first sensors configured to measure a state of a mobile object, the mobile object being an autonomous vehicle or an autonomous robot;

second sensors configured to measure a state of a first environment surrounding the mobile object;

wherein the motion estimation method comprises:

analyzing mobile object state data measured by the first sensors, and generate first motion analysis data representing actual motion of the mobile object in the first environment;

analyzing environment state data measured by the second sensors, and generate environment analysis data representing a state of the first environment;

inputting the environment analysis data to the model for estimating motion of the mobile object in the first environment, and estimate the motion of the mobile object in the first environment to generate motion estimation result data;

determining whether the first motion analysis data is outside a confidence interval over a predetermined range, wherein the confidence interval is based on motion estimation result data estimated by the model; and in response to determining that the first motion analysis data is outside the confidence interval over the predetermined range, instructing a learning model to relearn the model.

8. The motion estimation method according to claim 7, wherein the model is learned using the first motion analysis data, second motion analysis data generated for each of second environments, and a similarity in geological features for each position in the first environment and the second environments.

9. A path generation method performed by a path generation apparatus storing a model, the path generation method comprising:

generating first motion analysis data representing actual motion of a mobile object in a first environment, the mobile object being an autonomous vehicle or an autonomous robot;

analyzing the first environment, based on environment state data representing a state of the first environment, and generating environment analysis data;

inputting the environment analysis data to the model for estimating motion of a mobile object in the first environment and estimating the motion of the mobile object in the first environment to generate motion estimation result data;

determining whether the first motion analysis data is outside a confidence interval over a predetermined range, wherein the confidence interval is based on motion estimation result data estimated by the model;

in response to determining that the first motion analysis data is outside the confidence interval over the predetermined range, instructing a learning device for learning the model to relearn the model;

if the model is relearned, regenerating path data representing a path from a current position to a destination, based on motion estimation result data generated using the relearned model;

generating information for controlling movement of the mobile object, based on the motion estimation result data and the path data, and controlling the mobile object to move from the current position to the destination; and in the current position, if the motion estimation result data is higher than a risk threshold, generating the path data since the path is to be modified, or in the current position, if the motion estimation result data is equal to or lower than the risk threshold, the path is not to be modified.

10. The path generation method according to claim 9, wherein the model is learned using the first motion analysis data, second motion analysis data generated for each of second environments, and a similarity of geological features for each position in the first environment and the second environments.

11. A non-transitory computer-readable recording medium storing a program performed by a path generation apparatus to perform processing, the path generation apparatus storing a model, the processing comprising:

generating first motion analysis data representing actual motion of a mobile object in a first environment, the mobile object being an autonomous vehicle or an autonomous robot;

analyzing the first environment, based on environment state data representing a state of the first environment, and generating environment analysis data;

inputting the environment analysis data to the model for estimating motion of a mobile object in the first environment and estimating the motion of the mobile object in the first environment to generate motion estimation result data;

determining whether the first motion analysis data is outside a confidence interval over a predetermined range, wherein the confidence interval is based on motion estimation result data estimated by the model;

in response to determining that the first motion analysis data is outside the confidence interval over the predetermined range, instructing a learning device for learning the model to relearn the model;

generating information for controlling movement of the mobile object, based on the motion estimation result data and path data, and controlling the mobile object to move from a current position to a destination; and in the current position, if the motion estimation result data is higher than a risk threshold, generating the path data since the path is to be modified, or in the current position, if the motion estimation result data is equal to or lower than the risk threshold, the path is not to be modified.

12. The non-transitory computer-readable recording medium according to claim 11, the model is learned using the first motion analysis data, second motion analysis data generated for each of second environments, and a similarity in geological features for each position in the first environment and the second environments.

13. The non-transitory computer-readable recording medium according to claim 11, wherein the processing further comprises:

if the model is relearned, regenerating path data representing a path from the current position to the destination, based on motion estimation result data generated using the relearned model.

14. The non-transitory computer-readable recording medium according to claim 13, wherein the model is learned using the first motion analysis data, second motion analysis data generated for each of second environments, and a similarity in geological features for each position in the first environment and the second environments.

* * * * *